US012727175B2

(12) United States Patent
Lee

(10) Patent No.: US 12,727,175 B2
(45) Date of Patent: Sep. 1, 2026

(54) SEMICONDUCTOR PACKAGE AND METHOD OF MANUFACTURING THE SAME

(71) Applicant: Samsung Electronics Co., Ltd., Suwon-si (KR)

(72) Inventor: Hajung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 254 days.

(21) Appl. No.: 18/380,222

(22) Filed: Oct. 16, 2023

(65) Prior Publication Data

US 2024/0128225 A1 Apr. 18, 2024

(30) Foreign Application Priority Data

Oct. 17, 2022 (KR) ........................ 10-2022-0133616

(51) Int. Cl.
*H10B 80/00* (2026.01)
*H10W 72/30* (2026.01)
(Continued)

(52) U.S. Cl.
CPC ............ *H10B 80/00* (2023.02); *H10W 90/00* (2026.01); *H10W 90/701* (2026.01);
(Continued)

(58) Field of Classification Search
CPC ... H01L 21/561; H01L 21/563; H01L 21/568; H01L 21/6835; H01L 2224/16148; H01L 2224/29078; H01L 2224/29387; H01L 2224/29999; H01L 2224/32145; H01L 2224/73204; H01L 2225/06513; H01L 2225/06517; H01L 2225/06541;
(Continued)

(56) References Cited

U.S. PATENT DOCUMENTS 9,184,153 B2 11/2015 Lu et al.
10,043,780 B2 8/2018 Choi et al.
(Continued)

FOREIGN PATENT DOCUMENTS

KR 1020180005463 A 1/2018
KR 1020190136459 A 12/2019
KR 1020220007410 A 1/2022

*Primary Examiner* — Shaun M Campbell
(74) *Attorney, Agent, or Firm* — Muir Patent Law, PLLC

(57) ABSTRACT

A semiconductor package is provided. The semiconductor package includes a first semiconductor chip, a plurality of second semiconductor chips sequentially stacked on the first semiconductor chip, a front connection pad disposed on a lower surface of the plurality of second semiconductor chips, a rear connection pad attached on an upper surface of the first semiconductor chip and the second semiconductor chips, a chip connection terminal disposed between the front connection pad and the rear connection pad, and an insulating adhesive layer disposed between the first semiconductor chip and a lowermost second semiconductor chip and between two adjacent second semiconductor chips, the insulating adhesive layer including a first material layer covering a sidewall of the chip connection terminal and having first viscosity and a second material layer disposed to surround the first material layer in a plan view and have second viscosity which is greater than the first viscosity.

20 Claims, 23 Drawing Sheets

(51) Int. Cl.
*H10W 74/15* (2026.01)
*H10W 90/00* (2026.01)
*H10W 90/20* (2026.01)

(52) U.S. Cl.
CPC ........ *H10W 72/324* (2026.01); *H10W 72/325* (2026.01); *H10W 72/351* (2026.01); *H10W 72/353* (2026.01); *H10W 72/355* (2026.01); *H10W 74/15* (2026.01); *H10W 90/297* (2026.01); *H10W 90/722* (2026.01); *H10W 90/732* (2026.01)

(58) Field of Classification Search
CPC . H01L 2225/06565; H01L 2225/06582; H01L 2225/06586; H01L 23/3128; H01L 23/3135; H01L 23/49816; H01L 24/05; H01L 24/13; H01L 24/16; H01L 24/29; H01L 24/32; H01L 24/33; H01L 24/73; H01L 24/83; H01L 24/92; H01L 25/0657; H01L 25/50; H01L 2924/1434; H10B 80/00; H10P 72/74; H10W 72/073; H10W 72/20; H10W 72/30; H10W 72/324; H10W 72/325; H10W 72/351; H10W 72/353; H10W 72/355; H10W 72/851; H10W 72/90; H10W 74/012; H10W 74/014; H10W 74/019; H10W 74/117; H10W 74/121; H10W 74/15; H10W 90/00; H10W 90/26; H10W 90/291; H10W 90/297; H10W 90/701; H10W 90/722; H10W 90/724; H10W 90/732; H10W 99/00
See application file for complete search history.

(56) References Cited

U.S. PATENT DOCUMENTS

| | | | | |
|---|---|---|---|---|
| 10,354,985 | B2 | 7/2019 | Chang et al. | |
| 10,403,603 | B2 | 9/2019 | Park et al. | |
| 10,665,571 | B2 | 5/2020 | Lee | |
| 10,930,613 | B2 | 2/2021 | Park et al. | |
| 11,024,595 | B2 | 6/2021 | McClain et al. | |
| 2005/0277231 | A1* | 12/2005 | Hembree | H10F 39/804 438/126 |
| 2013/0234320 | A1* | 9/2013 | Lu | H01L 24/96 257/737 |
| 2018/0006006 | A1* | 1/2018 | Kim | H01L 23/3185 |
| 2018/0012866 | A1* | 1/2018 | Choi | H01L 25/0657 |
| 2023/0395479 | A1* | 12/2023 | Juang | H01L 23/49822 |

* cited by examiner

W1
410
212
250
230
214
CHR

FIG. 21

260S 268
264L
262P
260P
266
CHR

SEMICONDUCTOR PACKAGE AND METHOD OF MANUFACTURING THE SAME

CROSS-REFERENCE TO RELATED APPLICATION

This application is based on and claims priority under 35 U.S.C. § 119 to Korean Patent Application No. 10-2022-0133616, filed on Oct. 17, 2022, in the Korean Intellectual Property Office, the disclosure of which is incorporated by reference herein in its entirety.

BACKGROUND

The inventive concept relates to a semiconductor package and a method of manufacturing the same, and more particularly, to a semiconductor package including a plurality of semiconductor chips which are vertically stacked and a method of manufacturing the semiconductor package.

As the electronics industry advances rapidly and the demands of users increase, semiconductor packages mounted on electronic products need to have high performance and various functions, and thus, semiconductor packages each including a plurality of semiconductor chips have been proposed. Also, semiconductor packages where a plurality of semiconductor chips are vertically stacked have been developed for decreasing a size of semiconductor packages each including a plurality of semiconductor chips.

SUMMARY

The inventive concept provides a semiconductor package, including a plurality of semiconductor chips which are vertically stacked, in which a small size and high performance are implemented.

According to an aspect of the inventive concept, there is provided a semiconductor package including a first semiconductor chip, a plurality of second semiconductor chips sequentially stacked on the first semiconductor chip, a front connection pad disposed on a lower surface of each of the plurality of second semiconductor chips, a rear connection pad attached on an upper surface of the first semiconductor chip and each of the plurality of second semiconductor chips, a chip connection terminal disposed between the front connection pad and the rear connection pad, and an insulating adhesive layer disposed between the first semiconductor chip and a lowermost second semiconductor chip and between two adjacent second semiconductor chips of the plurality of second semiconductor chips, the insulating adhesive layer including a first material layer covering a sidewall of the chip connection terminal and having first viscosity and a second material layer disposed to surround the first material layer in a plan view and have second viscosity which is greater than the first viscosity.

According to another aspect of the inventive concept, there is provided a semiconductor package including a first semiconductor chip, a plurality of second semiconductor chips sequentially stacked on the first semiconductor chip, a front connection pad disposed on a lower surface of each of the plurality of second semiconductor chips, a rear connection pad attached on an upper surface of the first semiconductor chip and each of the plurality of second semiconductor chips, a chip connection terminal disposed between the front connection pad and the rear connection pad, an insulating adhesive layer disposed between the first semiconductor chip and a lowermost second semiconductor chip and between two adjacent second semiconductor chips of the plurality of second semiconductor chips, the insulating adhesive layer including a first material layer covering a sidewall of the chip connection terminal and a second material layer disposed on at least one side of the first material layer to have viscosity which is greater than viscosity of the first material layer, and a molding layer covering side surfaces of the first semiconductor chip and the plurality of second semiconductor chips and contacting a side surface of the second material layer.

According to another aspect of the inventive concept, there is provided a semiconductor package including a redistribution layer (RDL) interposer, a buffer chip including a first substrate, a plurality of first through electrodes passing through at least a portion of the first substrate, a first wiring layer disposed on an active surface of the first substrate, the first wiring layer including a plurality of first wiring patterns a plurality of first wiring vias, and a first inter-wiring insulation layer surrounding the plurality of first wiring patterns and the plurality of first wiring vias, the active surface of the first substrate facing the RDL interposer, and the buffer chip being attached on the RDL interposer, a plurality of memory cell chips each including a second substrate, a plurality of second through electrodes passing through at least a portion of the second substrate, a second wiring layer disposed on an active surface of the second substrate, the second wiring layer including a plurality of second wiring patterns, a plurality of second wiring vias, and a second inter-wiring insulation layer surrounding the plurality of second wiring patterns and the plurality of second wiring vias, the active surface of the second substrate facing the buffer chip, and the plurality of memory cell chips being sequentially stacked on the buffer chip, a plurality of front connection pads attached on a lower surface of the second wiring layer, a plurality of rear connection pads attached on an inactive surface of the first substrate and an inactive surface of the second substrate, a plurality of chip connection terminals disposed between the buffer chip and the plurality of memory cell chips and between the plurality of front connection pads and the plurality of rear connection pads, an insulating adhesive layer disposed between the buffer chip and the plurality of memory cell chips, the insulating adhesive layer including a first material layer covering a sidewall of a corresponding chip connection terminal and a second material layer disposed on at least one side of the first material layer to have viscosity which is greater than viscosity of the first material layer, and a molding layer surrounding the plurality of memory cell chips and the insulating adhesive layer, on the buffer chip.

BRIEF DESCRIPTION OF THE DRAWINGS

Embodiments will be more clearly understood from the following detailed description taken in conjunction with the accompanying drawings in which like numerals refer to like elements. In the drawings:

FIG. 5 is a plan view schematically illustrating the semiconductor package of FIG. 1;

Figure 15:
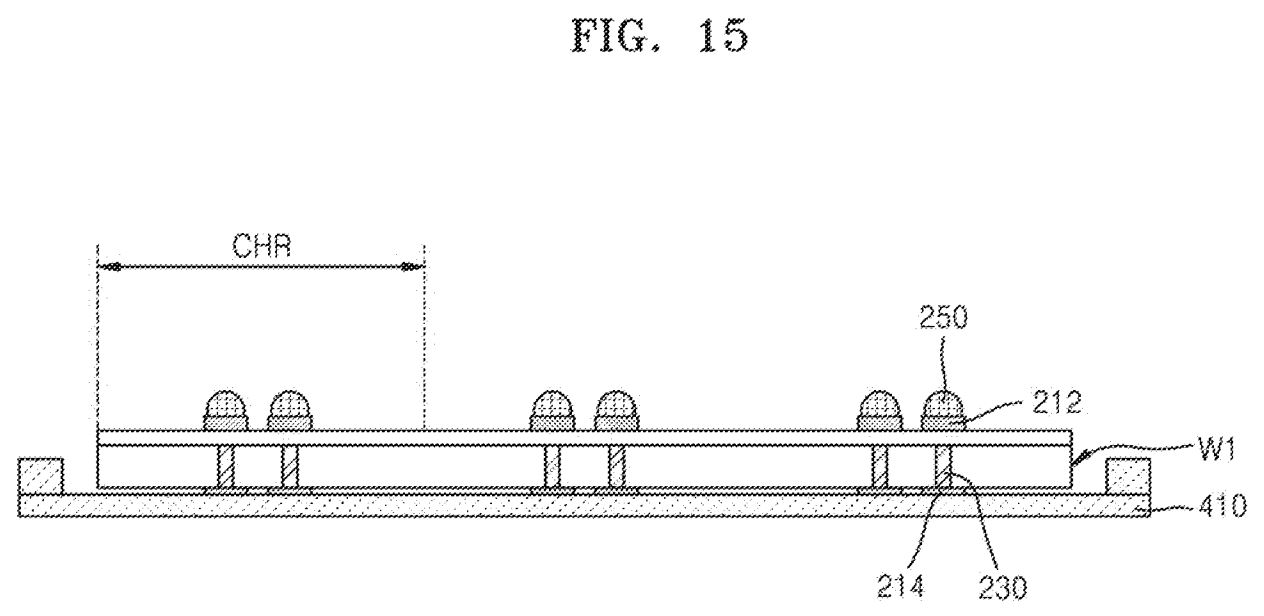

FIGS. 14 to 20 are cross-sectional views illustrating a method of manufacturing a semiconductor package, according to example embodiments; and FIGS. 21 to 23 are cross-sectional views illustrating a method of manufacturing a semiconductor package, according to example embodiments.

DETAILED DESCRIPTION OF THE EMBODIMENTS

Hereinafter, embodiments will be described in detail with reference to the accompanying drawings.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

Figure 1:
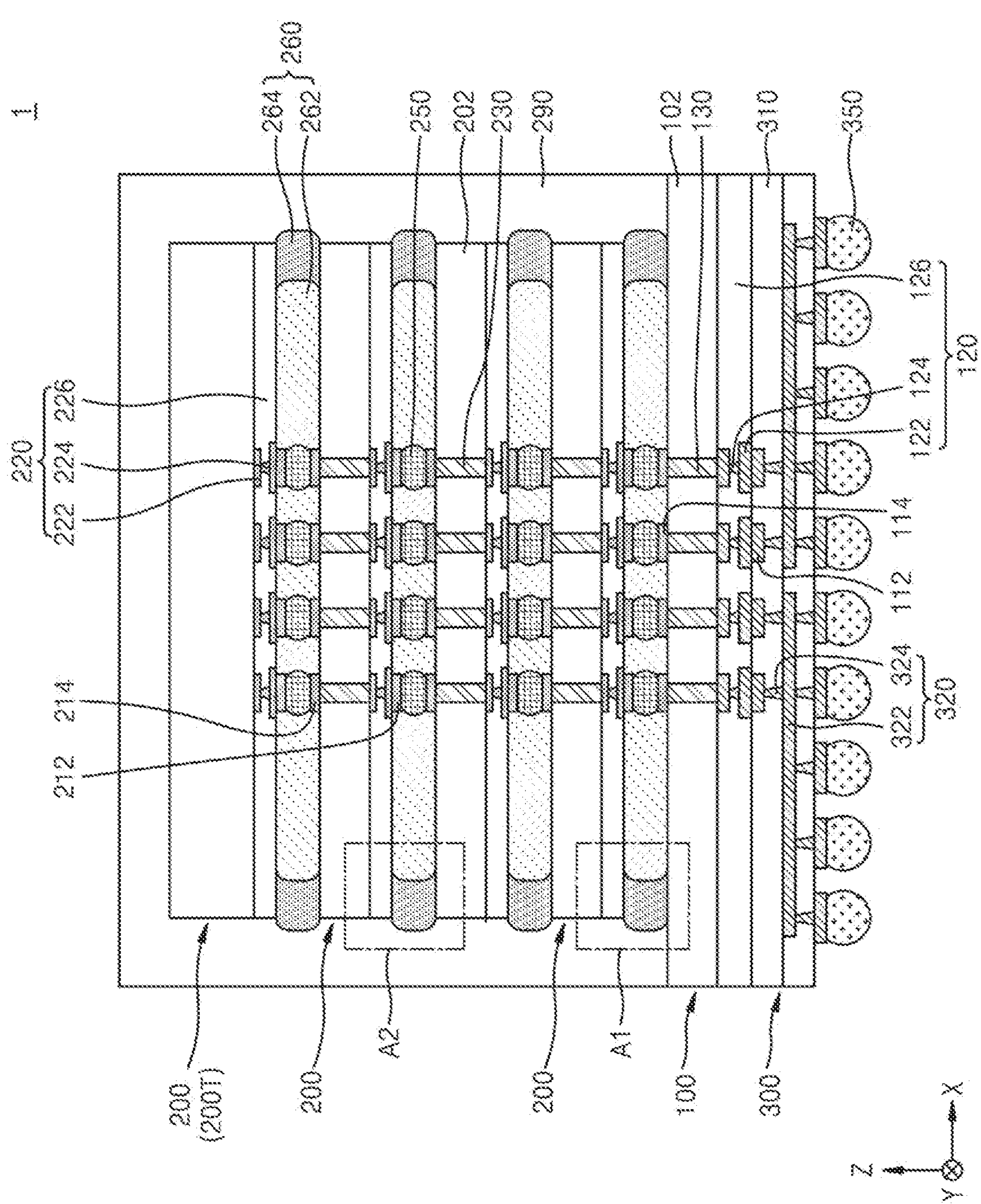
FIG. 1 is a cross-sectional view illustrating a semiconductor package according to example embodiments.
Figure 2:
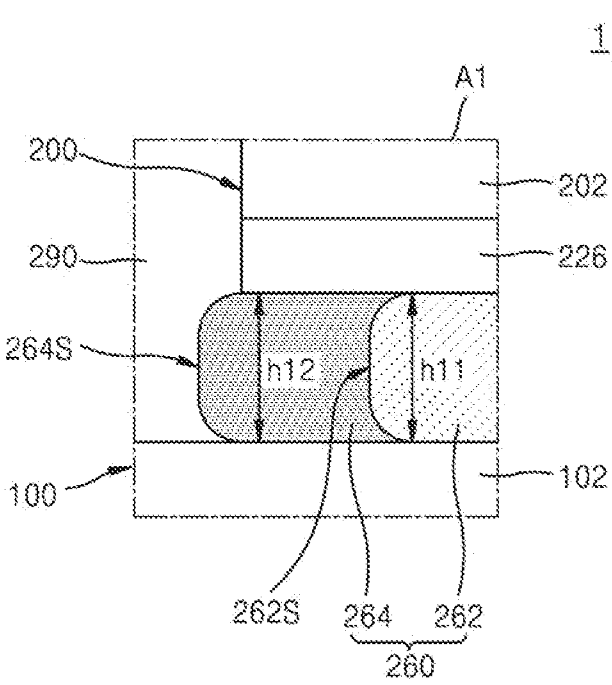
FIG. 2 is an enlarged view of a region A1 of FIG. 1.
Figure 3:
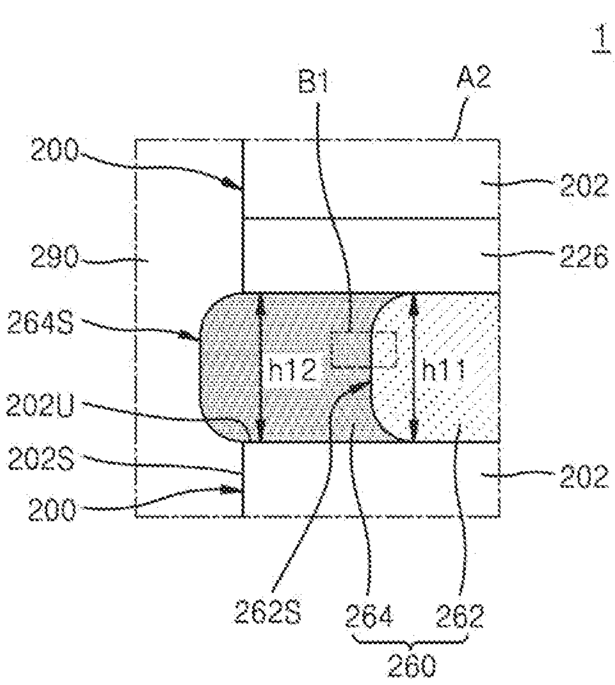
FIG. 3 is an enlarged view of a region A2 of FIG. 1.
Figure 4:
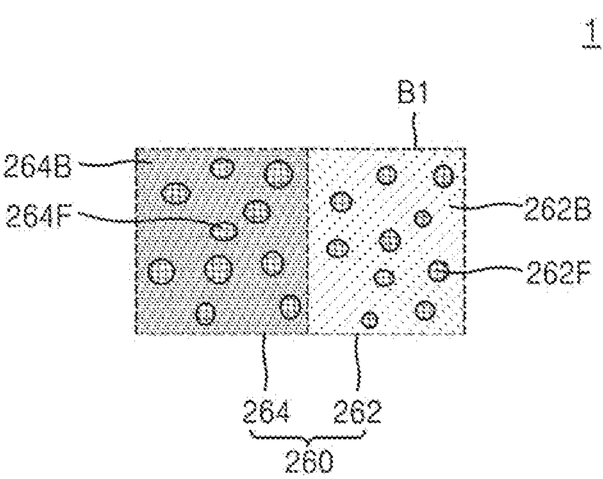
FIG. 4 is an enlarged view of a region B1 of FIG. 3.
Figure 5:
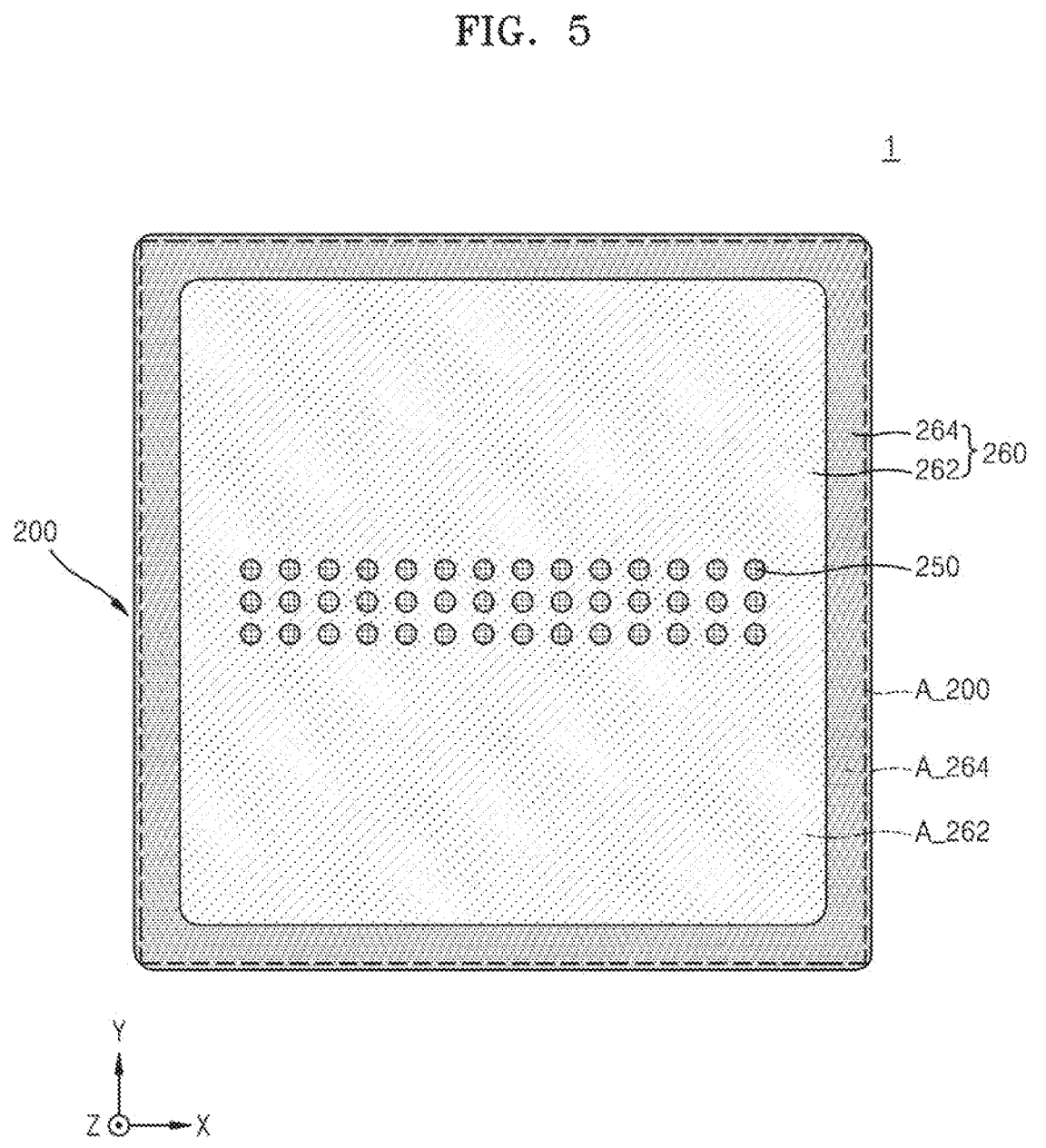

FIG. 1 is a cross-sectional view illustrating a semiconductor package 1 according to example embodiments. FIG. 2 is an enlarged view of a region A1 of FIG. 1, and FIG. 3 is an enlarged view of a region A2 of FIG. 1. FIG. 4 is an enlarged view of a region B1 of FIG. 3. FIG. 5 is a plan view schematically illustrating the semiconductor package 1 of FIG. 1.

Referring to FIGS. 1 to 5, the semiconductor package 1 may include an interposer 300, a first semiconductor chip 100, a plurality of second semiconductor chips 200 stacked on the first semiconductor chip 100, and an insulating adhesive layer 260 disposed between the first semiconductor chip 100 and the plurality of second semiconductor chips 200.

Herein, a region between the first semiconductor chip 100 and the plurality of second semiconductor chips 200 may denote a region between two adjacent semiconductor chips of semiconductor chips including the first semiconductor chip 100 and the plurality of second semiconductor chips 200. For example, a region between the first semiconductor chip 100 and the plurality of second semiconductor chips 200 may denote a region between the first semiconductor chip 100 and a lowermost second semiconductor chip 200 of the plurality of second semiconductor chips 200 and a region between two adjacent second semiconductor chips 200 of the plurality of second semiconductor chips 200.

In FIG. 1, the semiconductor package 1 is illustrated as including one first semiconductor chip 100 and four second semiconductor chips 200, but embodiments are not limited thereto. For example, the semiconductor package 1 may include two or more second semiconductor chips 200. In some embodiments, the semiconductor package 1 may include a four-multiple of second semiconductor chips 200. The plurality of second semiconductor chips 200 may be sequentially stacked in a vertical direction Z on the first semiconductor chip 100. Each of the first semiconductor chip 100 and the plurality of second semiconductor chips 200 may be sequentially stacked so that an active surface thereof faces a portion thereunder (i.e., the interposer 300).

In some embodiments, the interposer 300 may be a redistribution layer (RDL) interposer. The interposer 300 may include at least one redistribution insulation layer 310 and a plurality of redistribution patterns 320. The plurality of redistribution patterns 320 may include a plurality of redistribution line patterns 322 and a plurality of redistribution vias 324. In some embodiments, the interposer 300 may include a plurality of redistribution insulation layers 310 which are stacked. The redistribution insulation layer 310 may be formed from, for example, a photo imageable dielectric (PID) or photosensitive polyimide (PSPI). The plurality of redistribution patterns 320 including the plurality of redistribution line patterns 322 and the plurality of redistribution vias 324 may include, for example, metal such as copper (Cu), aluminum (Al), tungsten (W), titanium (Ti), tantalum (Ta), indium (In), molybdenum (Mo), nickel (Ni), manganese (Mn), cobalt (Co), tin (Sn), nickel (Ni), magnesium (Mg), rhenium (Re), beryllium (Be), gallium (Ga), or ruthenium (Ru), or an alloy thereof, but are not limited thereto. In some embodiments, the plurality of redistribution patterns 320 may be formed by stacking metal or an alloy of metals on a seed layer including titanium, titanium nitride, or titanium tungsten.

The plurality of redistribution line patterns 322 may be disposed on at least one of an upper surface and a lower surface of the redistribution insulation layer 310. Each of the plurality of redistribution vias 324 may pass through the at least one redistribution insulation layer 310 and may contact a portion of a corresponding redistribution line pattern 322 of the plurality of redistribution line patterns 322. In some embodiments, at least some of the plurality of redistribution line patterns 322 may be formed and provided integrally with some of the plurality of redistribution vias 324. For example, the redistribution line pattern 322 may be provided integrally with the redistribution via 324 contacting an upper surface of the redistribution line pattern 322.

In some embodiments, each of the plurality of redistribution vias 324 may have a tapered shape where a horizontal width thereof narrows progressively toward an upper portion thereof from a lower portion thereof and extends. For example, the plurality of redistribution vias 324 may each have a horizontal width which increases in a direction distancing from the first semiconductor chip 100.

Some redistribution line patterns 322 disposed on an upper surface of the interposer 300 among the plurality of redistribution line patterns 322 may be referred to as redistribution top pads, and some redistribution line patterns 322 disposed on a lower surface of the interposer 300 among the plurality of redistribution line patterns 322 may be referred to as redistribution bottom pads. A first front connection pad 112 may be connected to the redistribution top pad, and a package connection terminal 350 may be attached on the redistribution bottom pad. The package connection terminal 350 may perform a function of an external connection terminal of the semiconductor package 1. The package connection terminal 350 may connect the semiconductor package 1 with the outside. In some embodiments, the package connection terminal 350 may be a bump or a solder ball.

In some other embodiments, the interposer 300 may be a silicon interposer. When the interposer 300 is a silicon interposer, the interposer 300 may further include a base layer including silicon and an internal through electrode passing through the base layer and may include an interposer bottom pad which is disposed on a lower surface of the base layer and on which the package connection terminal 350 is attached, instead of the redistribution bottom pad.

The first semiconductor chip 100 may include a first substrate 102, a first wiring layer 120, and a plurality of first through electrodes 130. A plurality of first front connection pads 112 may be attached on a lower surface of the first semiconductor chip 100, and a plurality of first rear connection pads 114 may be attached on an upper surface of the first semiconductor chip 100. Each second semiconductor chip 200 may include a second substrate 202, a second wiring layer 220, and a plurality of second through electrodes 230. A plurality of second front connection pads 212 may be attached on a lower surface of each second semiconductor chip 200, and a plurality of second rear connection pads 214 may be attached on an upper surface of each second semiconductor chip 200.

Herein, a front surface and a rear surface may respectively denote a surface disposed at an active surface side and a surface disposed at an inactive surface side, respectively, and an upper surface and a lower surface may respectively denote a surface disposed at an upper side and a surface disposed at a lower side, respectively, in the drawings.

The first substrate 102 and the second substrate 202 may include silicon (Si). Alternatively, the first substrate 102 and the second substrate 202 may include a semiconductor element, such as germanium (Ge), or a compound semiconductor such as silicon carbide (SiC), gallium arsenide (GaAs), indium arsenide (InAs), or indium phosphide (InP). The first substrate 102 and the second substrate 202 may each include an active surface and an inactive surface opposite to the active surface. The first substrate 102 and the second substrate 202 may each include various kinds of a plurality of individual devices on the active surface thereof. For example, the active surface may be a surface on which devices are formed, and the inactive surface may be a surface which does not include any devices. The plurality of individual devices may include microelectronics devices, and for example, may include a metal-oxide-semiconductor field effect transistor (MOSFET) such as a complementary metal-insulator-semiconductor (CMOS) transistor, system large scale integration (LSI), an image sensor such as a CMOS imaging sensor (CIS), a micro-electro-mechanical system (MEMS), an active device, and a passive device.

The first semiconductor chip 100 and the second semiconductor chip 200 may include a first semiconductor device and a second semiconductor device, respectively, which are configured by the plurality of individual devices. The first semiconductor chip 100 may be disposed on the active surface of the first substrate 102, and the second semiconductor chip 200 may be disposed on the active surface of the second substrate 202.

The first semiconductor chip 100 and the plurality of second semiconductor chips 200 may include dynamic random access memory (DRAM), static random access memory (SRAM), flash memory, electrically erasable and programmable read-only memory (EEPROM), phase-change random access memory (PRAM), magnetic random access memory (MRAM), or resistive random access memory (RRAM).

In some embodiments, the first semiconductor chip 100 may not include a memory cell. The first semiconductor device included in the first semiconductor chip 100 may include a signal interface circuit, such as PHY, and a test logic circuit such as a serial-parallel conversion circuit, a design for test (DFT), a joint test action group (JTAG), and a memory built-in self-test (MBIST). The second semiconductor device included in the plurality of second semiconductor chips 200 may each include a memory cell. For example, the first semiconductor chip 100 may be a buffer chip for the control of the plurality of second semiconductor chips 200.

In some embodiments, the first semiconductor chip 100 may be a buffer chip for the control of HBM DRAM, and the plurality of second semiconductor chips 200 may each be a memory cell chip including a cell of HBM DRAM controlled by the first semiconductor chip 100. The first semiconductor chip 100 may be referred to as a buffer chip or a master chip, and the second semiconductor chip 200 may be referred to as a memory cell chip or a slave chip. The first semiconductor chip 100 and the plurality of second semiconductor chips 200 stacked on the first semiconductor chip 100 may be referred to as an HBM DRAM device or an HBM DRAM chip.

The first wiring layer 120 may be disposed on an active surface of the first substrate 102. Each of the plurality of first front connection pads 112 and the plurality of first rear connection pads 114 may be disposed on the first wiring layer 120 and the inactive surface of the first substrate 102, respectively. For example, the plurality of first rear connection pads 114 may be disposed on an upper surface of the first semiconductor chip 100, and the plurality of first front connection pads 112 may be disposed on a lower surface of the first semiconductor chip 100.

The first wiring layer 120 may include a plurality of first wiring patterns 122, a plurality of first wiring vias 124, and a first inter-wiring insulation layer 126. The plurality of first wiring vias 124 may be connected with upper surfaces and/or lower surfaces of the plurality of first wiring patterns 122. In some embodiments, the plurality of first wiring patterns 122 may be arranged apart from one another at different vertical levels, and the plurality of first wiring vias 124 may connect the first wiring patterns 122, arranged at different vertical levels, with one another. The plurality of first wiring patterns 122 and the plurality of first wiring vias 124 may electrically connect the plurality of first through electrodes 130 with the plurality of first front connection pads 112. The first inter-wiring insulation layer 126 may surround the plurality of first wiring patterns 122 and the plurality of first wiring vias 124.

The plurality of first through electrodes 130 may vertically pass through at least a portion of the first substrate 102 and may electrically connect the plurality of first front connection pads 112 with the plurality of first rear connection pads 114. For example, the plurality of first front connection pads 112 may be electrically connected with the plurality of first rear connection pads 114 through the plurality of first through electrodes 130, the first wiring patterns 122, and the first wiring vias 124.

The second wiring layer 220 may be disposed on an active surface of the second substrate 202. The plurality of second front connection pads 212 and the plurality of second rear connection pads 214 may be disposed on the second wiring layer 220 and the inactive surface of the second substrate 202, respectively.

The second wiring layer 220 may include a plurality of second wiring patterns 222, a plurality of second wiring vias 224, and a second inter-wiring insulation layer 226. The plurality of second wiring vias 224 may be connected with upper surfaces and/or lower surfaces of the plurality of second wiring patterns 222. In some embodiments, the plurality of second wiring patterns 222 may be arranged apart from one another at different vertical levels, and the plurality of second wiring vias 224 may connect the second wiring patterns 222, arranged at different vertical levels, with one another. The plurality of second wiring patterns 222 and the plurality of second wiring vias 224 may electrically connect the plurality of second through electrodes 230 with the plurality of second front connection pads 212. The second inter-wiring insulation layer 226 may surround the plurality of second wiring patterns 222 and the plurality of second wiring vias 224.

The plurality of second through electrodes 230 may vertically pass through at least a portion of the second substrate 202 and may electrically connect the plurality of second front connection pads 212 with the plurality of second rear connection pads 214. For example, the plurality of second front connection pads 212 may be electrically connected with the plurality of second rear connection pads 214 through the plurality of second through electrodes 230, the second wiring patterns 222, and the second wiring vias 224.

The plurality of first wiring patterns 122, the plurality of first wiring vias 124, the plurality of second wiring patterns 222, and the plurality of second wiring vias 224 may include, for example, metal such as Cu, Al, W, Ti, Ta, Mo, Co, or Ni, an alloy thereof, or nitride of the metals. The first inter-wiring insulation layer 126 and the second inter-wiring insulation layer 226 may include high density plasma (HDP) oxide, tetra-ethyl-ortho-silicate (TEOS) oxide, tonen silazene (TOSZ) oxide, spin on glass (SOG), undoped silicate glass (USG), or a low-k dielectric layer.

Each of the plurality of first through electrodes 130 and the plurality of second through electrodes 230 may include a conductive plug and a conductive barrier layer surrounding the conductive plug. The conductive plug may include Cu or W. For example, the conductive plug may include Cu, CuSn, CuMg, CuNi, CuZn, CuPd, CuAu, CuRe, CuW, W, or a W alloy, but is not limited thereto. For example, the conductive plug may include one or more materials of aluminum (Al), gold (Au), beryllium (Be), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr) and may include one or more stack structures. The conductive barrier layer may include at least one material selected from among W, WN, WC, Ti, TiN, Ta, TaN, Ru, Co, Mn, WN, Ni, and NiB and may include a single layer or a multilayer.

A plurality of chip connection terminals 250 may be attached on the plurality of second front connection pads 212. Each of the plurality of chip connection terminals 250 may be disposed between the first rear connection pad 114 and the second front connection pad 212 opposite to each other or between the second rear connection pad 214 and the second front connection pad 212 opposite to each other. In detail, the plurality of chip connection terminals 250 may be disposed between the plurality of first rear connection pads 114 and a plurality of second front connection pads 212 attached on a lowermost second semiconductor chip 200 of the plurality of second semiconductor chips 200 and between a plurality of second front connection pads 212 attached on the other second semiconductor chip 200 of the plurality of second semiconductor chips 200 and a plurality of second rear connection pads 214 attached on the other second semiconductor chip 200 thereunder and may electrically connect the first semiconductor chip 100 with the plurality of second semiconductor chips 200.

A second front connection pad 212 on which the chip connection terminal 250 is attached may be referred to as a front connection pad, a first rear connection pad 114 and a second rear connection pad 214 on which the chip connection terminal 250 is attached may be referred to as a rear connection pad, and the first front connection pad 112 may be referred to as an interposer connection pad.

In some embodiments, an uppermost second semiconductor chip 200T disposed farthest away from the first semiconductor chip 100 among the plurality of second semiconductor chips 200 may not include the second rear connection pads 214 and the second through electrodes 230. In some embodiments, a thickness of the uppermost second semiconductor chip 200T disposed farthest away from the first semiconductor chip 100 among the plurality of second semiconductor chips 200 may have a value which is greater than that of a thickness of the other second semiconductor chip 200.

The insulating adhesive layer 260 may be attached on the inactive surface of the first substrate 102 and the inactive surface of the second substrate 202 other than that of the uppermost second semiconductor chip 200T of the plurality of second semiconductor chips 200 and may attach each of the plurality of second semiconductor chips 200 on a lower structure (for example, the first semiconductor chip 100 or the other second semiconductor chip 200 disposed at a lower side among the plurality of second semiconductor chips 200). The insulating adhesive layer 260 may surround the chip connection terminals 250 and may be filled between the first semiconductor chip 100 and the plurality of second semiconductor chips 200.

In embodiments, the insulating adhesive layer 260 may include a non-conductive film (NCF) including a heterogeneous material. The insulating adhesive layer 260 may be manufactured as a film type which is capable of being laminated and includes a heterogeneous material and may be attached on an upper surface of each of the first semiconductor chip 100 and the second semiconductor chip 200. For example, the insulating adhesive layer 260 may include a non-conductive film including a first material layer 262 and a second material layer 264, which have different compositions or different viscosities. For example, the first material layer 262 may include a material having a first viscosity, and the second material layer 264 may include a material having a second viscosity which is higher than the first viscosity.

In embodiments, the insulating adhesive layer 260 may include the first material layer 262, which surrounds the chip connection terminals 250 and is disposed in a center region between the first semiconductor chip 100 and each of the plurality of second semiconductor chips 200, and the second material layer 264 which is disposed to surround the first material layer 262 in a plan view. For example, in the insulating adhesive layer 260 disposed between two adjacent second semiconductor chips 200, as illustrated in FIG. 4, the first material layer 262 may be disposed on a center region of an upper surface of the second semiconductor chip 200, and the second material layer 264 may be disposed on an outer perimeter region of the upper surface of the second semiconductor chip 200. For example, the first material layer 262 may be disposed on the center region of the upper surface of the second semiconductor chip 200 and may have a first height h11. The second material layer 264 may be disposed on the outer perimeter region of the upper surface of the second semiconductor chip 200 and may have a second height h12 which is equal to the first height h11. The second material layer 264 may include an upper surface which is disposed at the same level as an upper surface of the first material layer 262.

In embodiments, the first viscosity of the first material layer 262 may be within a range of about 500 Pa·s (pascal·second) to about 5,000 Pa·s. The second viscosity of the second material layer 264 may be within a range of about 600 Pa·s to about 6,000 Pa·s. In some embodiments, the second viscosity of the second material layer 264 may be greater than or equal to about 120% of the first viscosity of the first material layer 262.

In embodiments, the first viscosity and the second viscosity may each be a value measured under the same temperature condition, and for example, may be a value measured under a temperature condition of about 100° C. In other embodiments, the first viscosity and the second viscosity may each be a lowest viscosity value measured in a temperature range of about 50° C. to about 200° C. In embodiments, the first viscosity and the second viscosity may be measured by an advanced rheometric expansion system (ARES) method, but embodiments are not limited thereto. In other embodiments, the first viscosity and the second viscosity may be measured by a viscosity measurer.

In embodiments, the first material layer 262 and the second material layer 264 may include at least one of acrylic resin, photo-curable resin, bisphenol-like epoxy resin, epoxy resin, novolac-like epoxy resin, phenol resin, urea resin, melamine resin, unsaturated polyester resin, and resorcinol resin.

In some embodiments, as schematically illustrated in FIG. 4, the first material layer 262 may include a resin-based base layer 262B and a ceramic filler 262F included in the resin-based base layer 262B, and the second material layer 264 may include a resin-based base layer 264B and a ceramic filler 264F included in the resin-based base layer 264B. In some embodiments, a content of the ceramic filler 264F included in the second material layer 264 may be greater than that of the ceramic filler 262F included in the first material layer 262. In other embodiments, an average diameter of the ceramic filler 264F included in the second material layer 264 may be greater than that of the ceramic filler 262F included in the first material layer 262. Because the content and/or average diameter of the ceramic filler 264F included in the second material layer 264 are/is greater than the content and/or average diameter of the ceramic filler 262F included in the first material layer 262, the second viscosity of the second material layer 264 may be greater than the first viscosity of the first material layer 262.

In embodiments, the second material layer 264 may include photo-curable resin and may increase in viscosity, based on irradiation of ultraviolet (UV) light, and thus, may have viscosity which is higher than that of the first material layer 262. In some embodiments, the first material layer 262 and the second material layer 264 may include photo-curable resin, and a content of the photo-curable resin of the second material layer 264 may be greater than that of the photo-curable resin of the first material layer 262. In other embodiments, the first material layer 262 may not include photo-curable resin and only the second material layer 264 may include photo-curable resin, and thus, only the second material layer 264 may selectively have viscosity, based on irradiation of UV light.

As illustrated in FIG. 5, in a plan view, the upper surface of the second semiconductor chip 200 may have a first area A_200, the first material layer 262 may have a second area A_262, and the second material layer 264 may have a third area A_264. In some embodiments, the insulating adhesive layer 260 may have substantially the same area as the first area A_200 of the second semiconductor chip 200. Also, the third area A_264 of the second material layer 264 may correspond to about 10% to about 50% of the first area A_200 of the second semiconductor chip 200, and the second area A_262 of the first material layer 262 may correspond to about 50% to about 90% of the first area A_200 of the second semiconductor chip 200.

According to embodiments, the first material layer 262 may have the first viscosity which is relatively low, and thus, the first material layer 262 may fully surround the chip connection terminals 250 in a process of bonding the first semiconductor chip 100 to the plurality of second semiconductor chips 200 by using a thermal compression process. Furthermore, because the first material layer 262 has the first viscosity which is relatively low, the first material layer 262 may have a relatively high flow speed and may overflow in a lateral direction (e.g., a first horizontal direction X and/or a second horizontal direction Y) in a space between the first semiconductor chip 100 and the plurality of second semiconductor chips 200. However, the first material layer 262 may be disposed in a center region between the first semiconductor chip 100 and the plurality of second semiconductor chips 200 (for example, disposed at a center portion in a plan view), and because the second material layer 264 surrounding a sidewall of the first material layer 262 has the second viscosity which is relatively high, the formation of a fillet, which excessively protrudes to the outside between the first semiconductor chip 100 and the plurality of second semiconductor chips 200, may be prevented.

The semiconductor package 1 may further include a molding layer 290 surrounding the plurality of second semiconductor chips 200 and the insulating adhesive layer 260, on the first semiconductor chip 100. The molding layer 290 may include, for example, an epoxy mold compound (EMC). In some embodiments, the molding layer 290 may cover side surfaces of the plurality of second semiconductor chips 200, a side surface of the insulating adhesive layer 260, and an upper surface of the uppermost second semiconductor chip 200T of the plurality of second semiconductor chips 200. The molding layer 290 may contact the second material layer 264 of the insulating adhesive layer 260 and may not contact the first material layer 262 of the insulating adhesive layer 260. For example, the molding layer 290 may be separated from the first material layer 262 by the second material layer 264.

As illustrated in FIG. 3, a sidewall 262S of the first material layer 262 may have a shape which protrudes to the outside, the second material layer 264 may cover an upper edge 200U of the second semiconductor chip 200, and a sidewall 264S of the second material layer 264 may protrude to the outside with respect to a sidewall 202S of the second substrate 202. However, the sidewall 202S of the second substrate 202 may not be covered by the second material layer 264 and may directly contact the molding layer 290. Because the second material layer 264 has the second viscosity which is relatively high, the second material layer 264 may function as a supporting unit which prevents the lateral-direction flow or expansion of the first material layer 262 and the excessive protrusion of the second material layer 264 to a sidewall of the second substrate 202 may be prevented, in a thermal compression process.

Generally, a plurality of semiconductor chips may be vertically stacked by a method of attaching a non-conductive film on a semiconductor chip and bonding a semiconductor chip to another semiconductor chip using a thermal compression process. However, as a non-conductive film has flowability and overflows to the outside of a semiconductor chip while a thermal compression process is being performed at a high temperature of about 300° C., a fillet may be formed, and depending on the case, the fillet may protrude up to an upper surface of the semiconductor chip and may be exposed at the outside of a molding layer. When the fillet is excessively formed, a defect of an external appearance may occur, and moreover, when warpage occurs in a substrate, a crack may be caused through the fillet, causing a reduction in reliability of a semiconductor package.

According to embodiments, the first material layer 262 having relatively low viscosity may be disposed on a center region of each of the first and second semiconductor chips 100 and 200, and the second material layer 264 having relatively high viscosity may be disposed on an outer region of each of the first and second semiconductor chips 100 and 200. The second material layer 264 may completely surround the first material layer 262 when viewed in plan view. Accordingly, the first material layer 262 may fully surround the chip connection terminals 250, and the second material layer 264 may function as a supporting unit which prevents the lateral-direction flow or protrusion of the first material layer 262. Therefore, the semiconductor package 1 may have excellent reliability.

Figure 6:
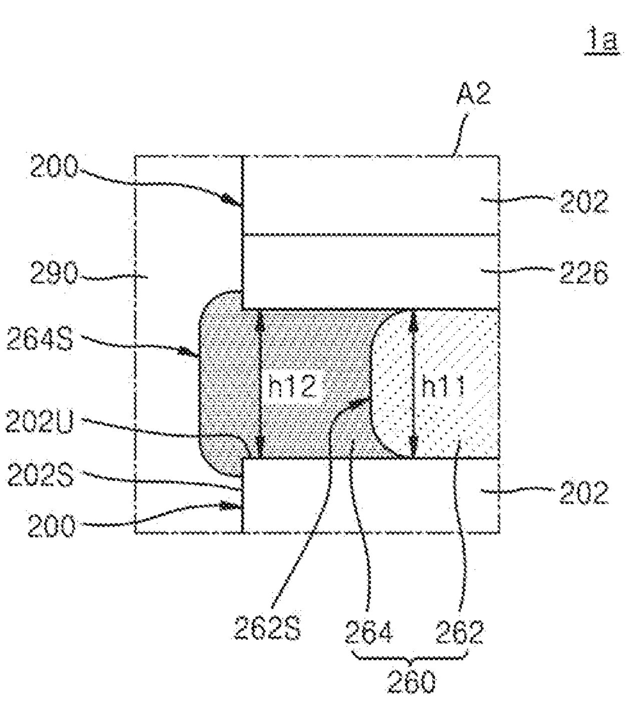
FIG. 6 is a cross-sectional view illustrating a semiconductor package according to example embodiments.

FIG. 6 is a cross-sectional view illustrating a semiconductor package 1*a* according to example embodiments.

Referring to FIG. 6, a sidewall 264S of a second material layer 264 may protrude to the outside with respect to a sidewall 202S of a second substrate 202 and may cover a portion of the sidewall 202S of the second substrate 202. For example, a portion of the second material layer 264 may contact a portion of the sidewall 202S of the second substrate 202. Another portion of the sidewall 202S of the second substrate 202 may not be covered by the second material layer 264 and may directly contact a molding layer 290.

Figure 7:
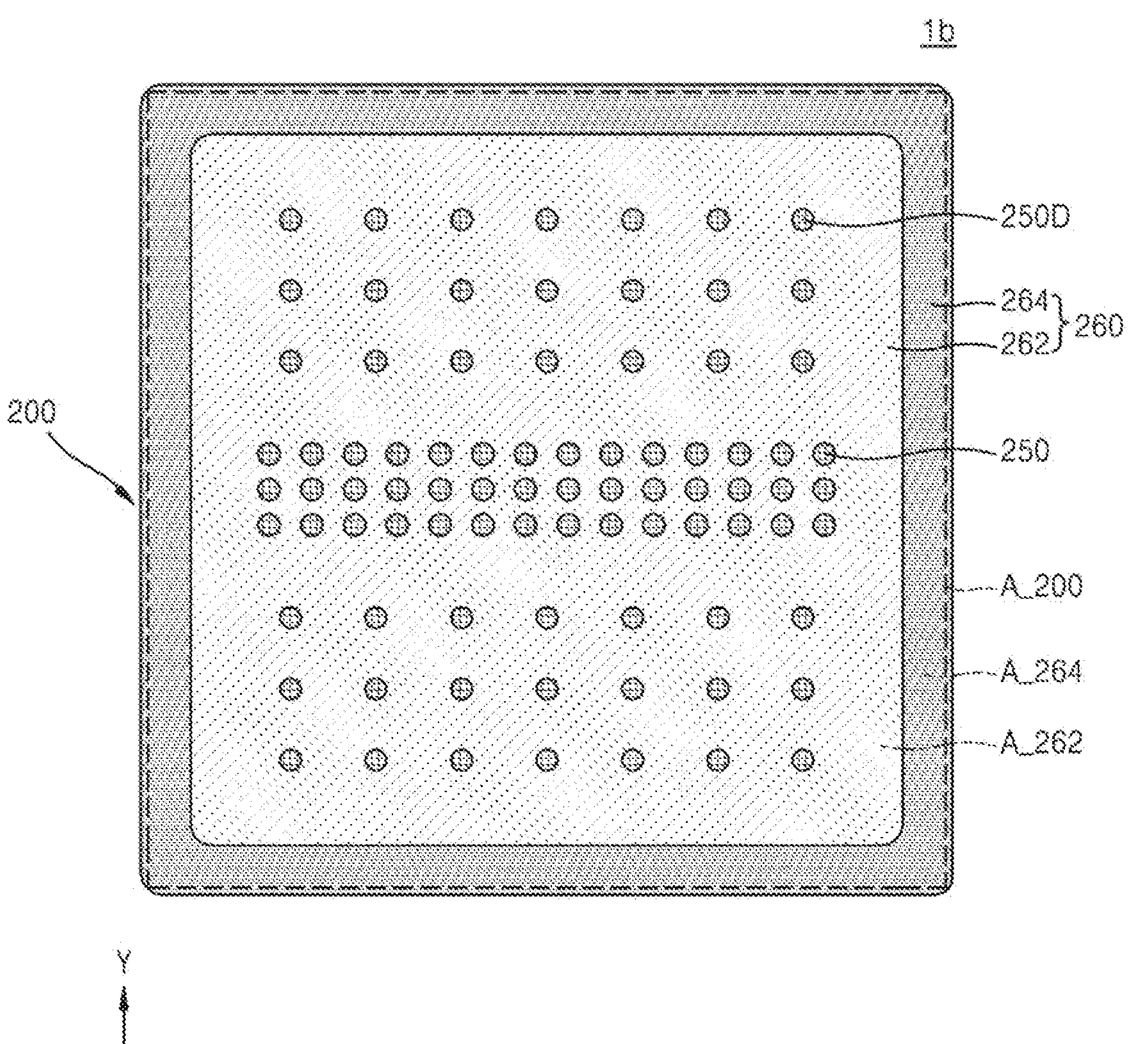
FIG. 7 is a plan view illustrating a semiconductor package according to example embodiments.

FIG. 7 is a plan view illustrating a semiconductor package 1*b* according to example embodiments.

Referring to FIG. 7, chip connection terminals 250 may be disposed on a center region of an upper surface of a second semiconductor chip 200, and dummy chip connection terminals 250D may be disposed at both sides of the chip connection terminals 250. For example, the chip connection terminals 250 may be disposed on the center region of an upper surface of the second semiconductor chip 200, and the dummy chip connection terminals 250D may be disposed at opposite side regions of the second semiconductor chip 200. The dummy chip connection terminals 250D may be disposed apart from each other in the first horizontal direction X and the second horizontal direction Y by a distance which is greater than a distance between two adjacent chip connection terminals 250 in the first horizontal direction X and the second horizontal direction Y, respectively. A first material layer 262 may be disposed to surround the chip connection terminals 250 and the dummy chip connection terminals 250D in a plan view, and a second material layer 264 may be disposed on an outer region of the second semiconductor chip 200 outside the first material layer 262 in a plan view.

Figure 8:
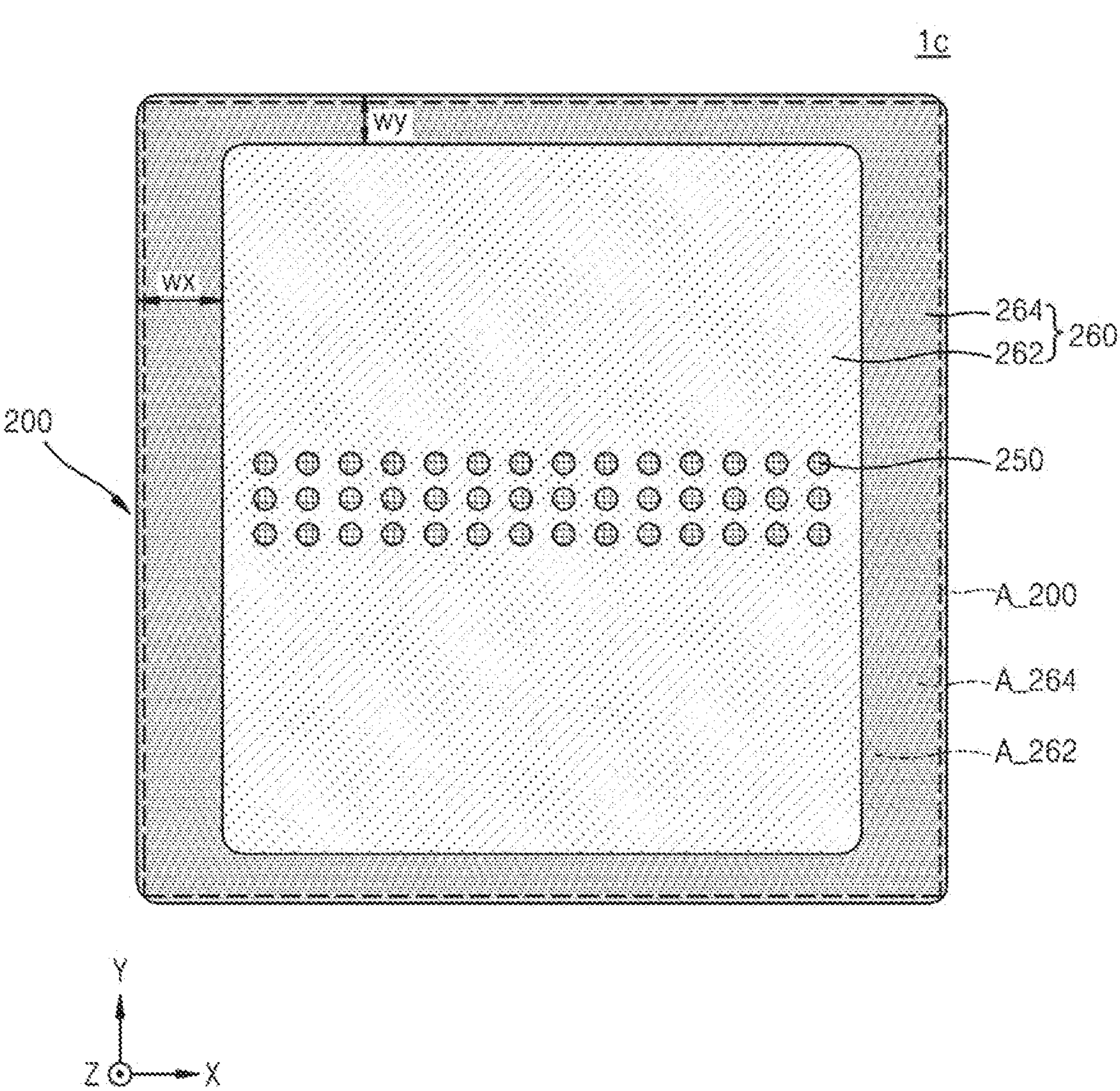
FIG. 8 is a plan view illustrating a semiconductor package according to example embodiments.
Figure 9:
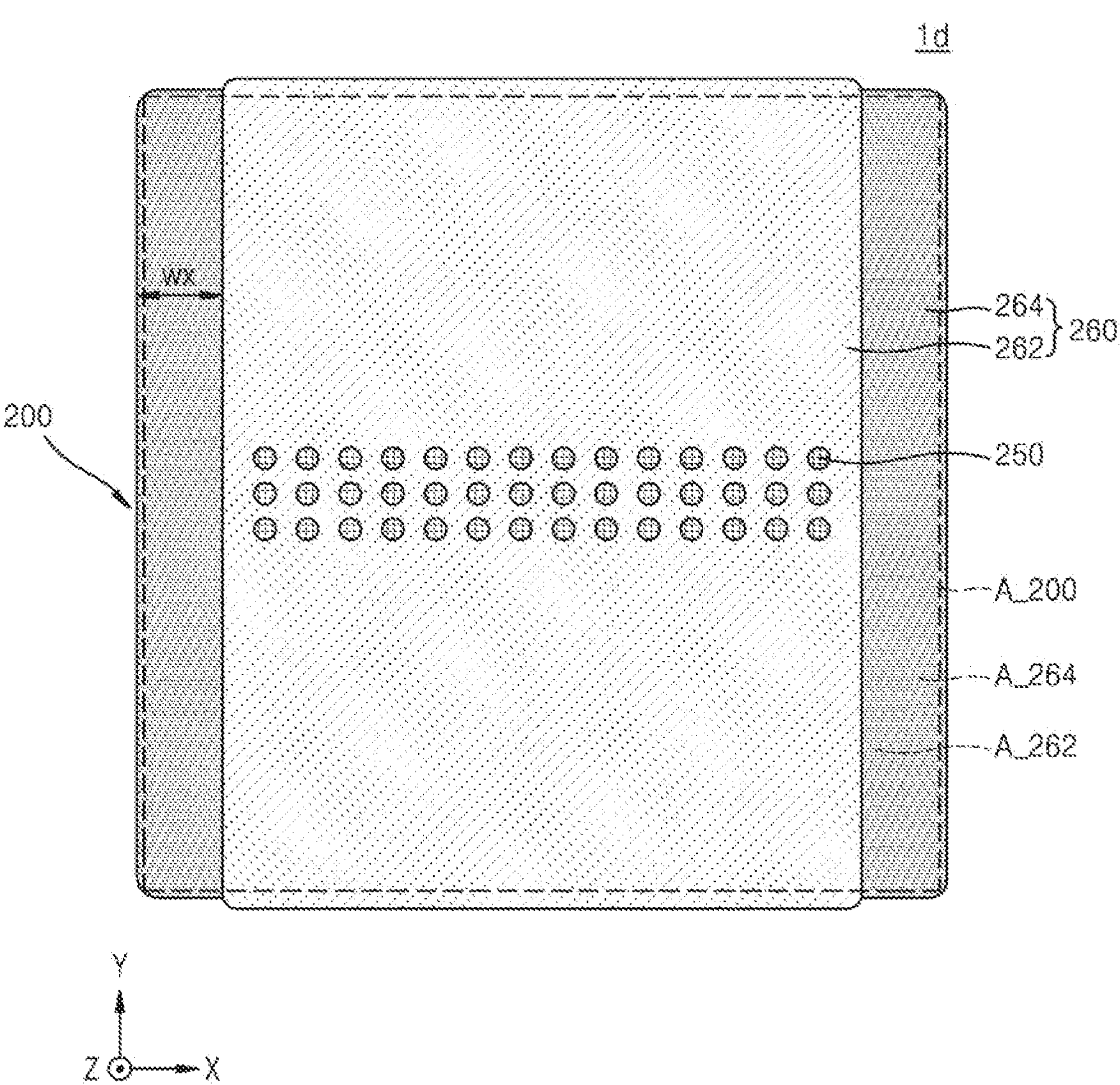
FIG. 9 is a plan view illustrating a semiconductor package according to example embodiments.

FIGS. 8 and 9 are plan views illustrating semiconductor packages 1*c* and 1*d* according to example embodiments.

Referring to FIG. 8, in the semiconductor package 1*c*, a portion of a second material layer 264 disposed on each of both sidewalls of a first material layer 262 in a second horizontal direction Y may have a first width wx in a first horizontal direction X, and a portion of the second material layer 264 disposed on each of both sidewalls of the first material layer 262 in the first horizontal direction X may have a second width wy in the second horizontal direction Y. The second width wy may differ from the first width wx. For example, the second width wy may be smaller than the first width wx. Alternatively, although not illustrated, the second width wy may be greater than the first width wx.

Referring to FIG. 9, in the semiconductor package 1*d*, a second material layer 264 may be disposed on only each of both sidewalls of a first material layer 262 in a second horizontal direction Y and may not be disposed on each of both sidewalls of the first material layer 262 in a first horizontal direction X. Accordingly, the both sidewalls of the first material layer 262 in the first horizontal direction X may directly contact a molding layer 290 (see FIG. 1).

Figure 10:
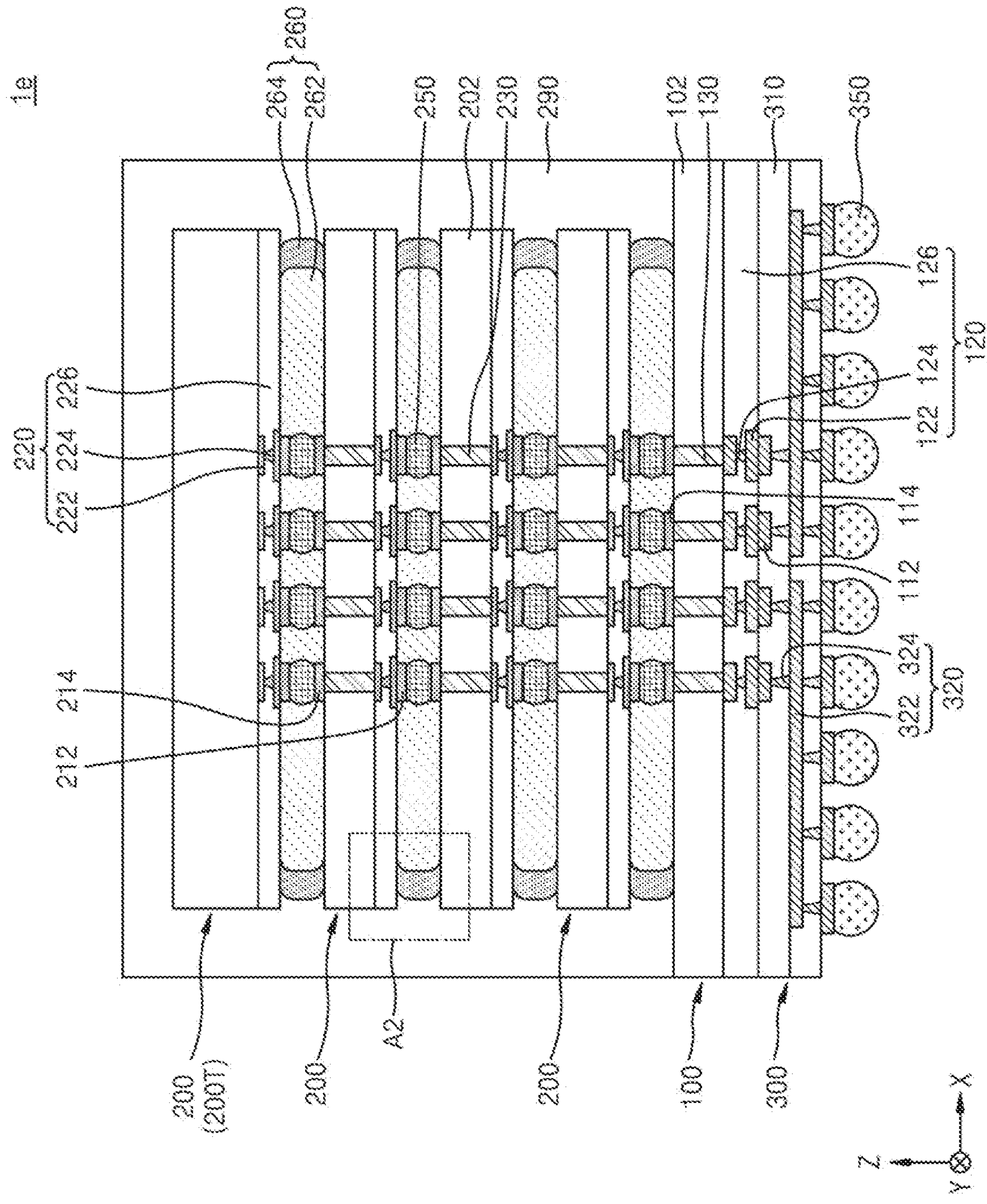
FIG. 10 is a cross-sectional view illustrating a semiconductor package according to example embodiments.
Figure 11:
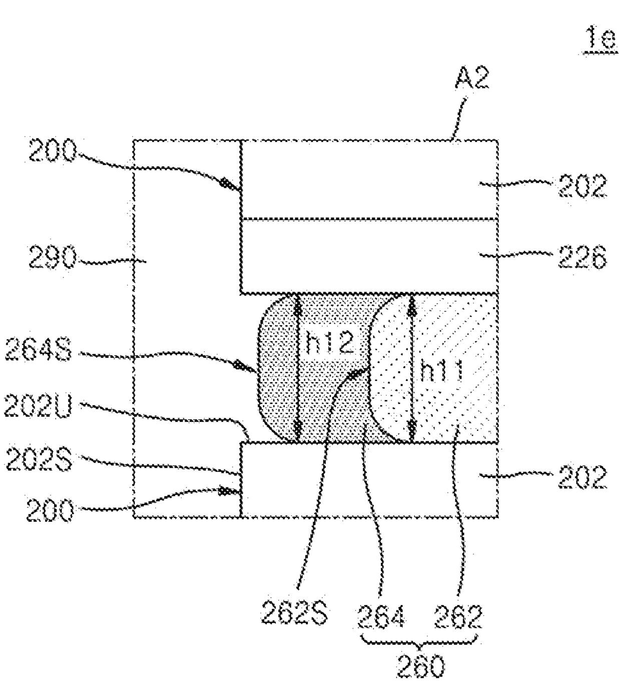
FIG. 11 is an enlarged view of a region A2 of FIG. 9.
Figure 12:
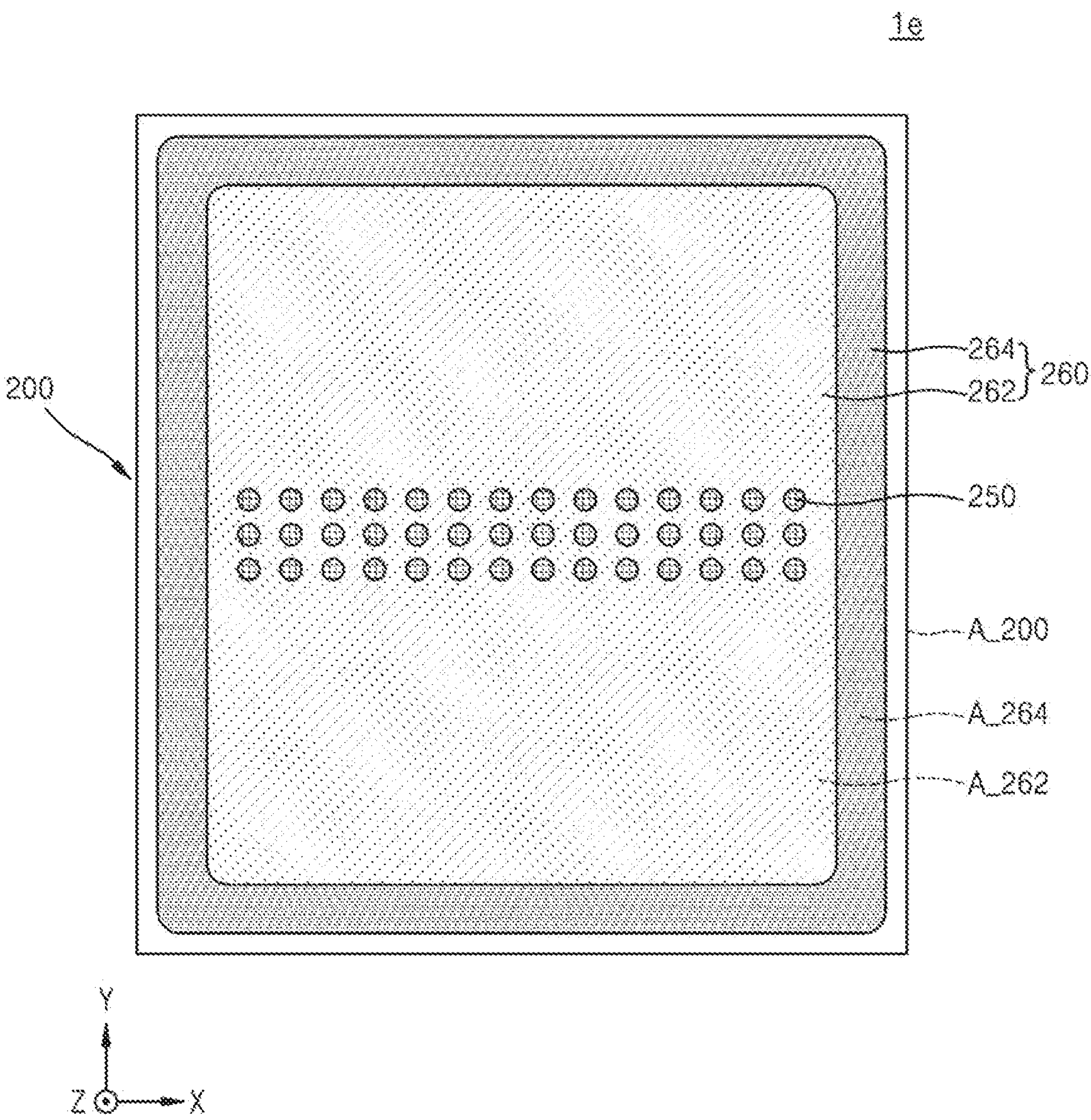
FIG. 12 is a plan view schematically illustrating the semiconductor package of FIG. 10.

FIG. 10 is a cross-sectional view illustrating a semiconductor package 1*e* according to example embodiments, FIG. 11 is an enlarged view of a region A2 of FIG. 10, and FIG. 12 is a plan view schematically illustrating the semiconductor package 1*e* of FIG. 10.

Referring to FIGS. 10 to 12, an insulating adhesive layer 260 may have an area which is less than a first area A_200 of a second semiconductor chip 200. Accordingly, an upper edge 202U of a second substrate 202 may not be covered by a second material layer 264, and the upper edge 202U of the second substrate 202 may be covered by a molding layer 290. For example, the molding layer 290 may contact the upper edge 202U of the second substrate 202 and a lower surface of the second inter-wiring insulation layer 226.

Figure 13:
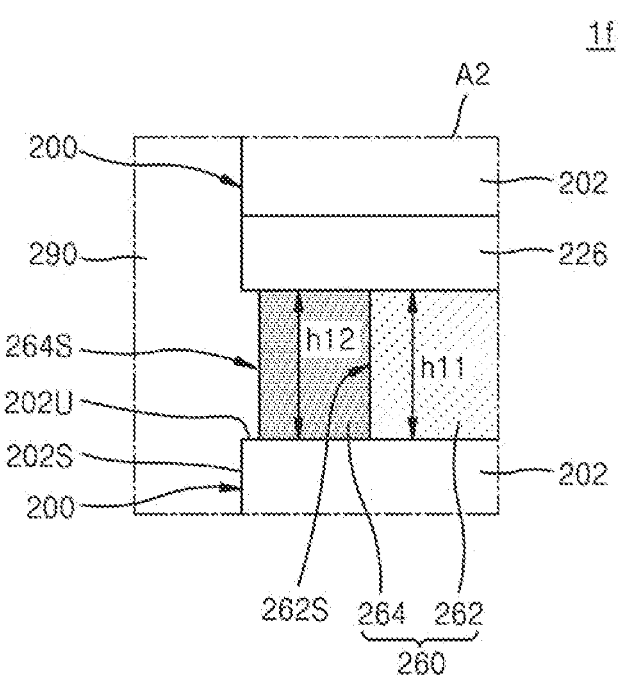
FIG. 13 is a cross-sectional view illustrating a semiconductor package according to example embodiments.

FIG. 13 is a cross-sectional view illustrating a semiconductor package if according to example embodiments.

Referring to FIG. 13, both sidewalls 264S of a second material layer 264 may straightly and vertically extend and may not protrude to the outside with respect to a sidewall of a second semiconductor chip 200 (for example, a sidewall 202S of a second substrate 202). For example, the sidewalls 264S of the second material layer 264 may have a planar shape in the vertical direction Z. Also, sidewalls 262S of a first material layer 262 contacting the second material layer 264 may straightly and vertically extend. For example, the sidewalls 262S of the first material layer 262 may have a planar shape in the vertical direction Z.

In embodiments, an average diameter of a ceramic filler 264F (see FIG. 4) included in the second material layer 264 may be greater than that of a ceramic filler 262F (see FIG. 4) included in the first material layer 262, or a content of the ceramic filler 264F included in the second material layer 264 may be greater than that of the ceramic filler 262F (see FIG. 4) included in the first material layer 262. Because the second material layer 264 has the second viscosity which is relatively high, the second material layer 264 may not flow or protrude in a lateral direction in a thermal compression process performed at a high temperature, and thus, the second material layer 264 may have a straight sidewall profile.

FIGS. 14 to 20 are cross-sectional views illustrating a method of manufacturing a semiconductor package, according to example embodiments.

Figure 14:
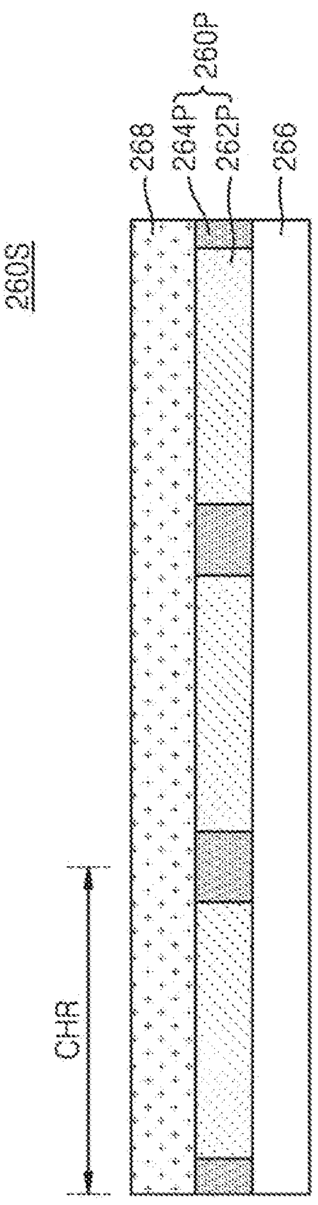

Referring to FIG. 14, an insulating adhesive film 260S may be prepared. The insulating adhesive film 260S may include an insulating adhesive pattern 260P, a cover film 266, and a base film 268.

For example, the insulating adhesive film 260S may include a plurality of first material layer patterns 262P and a second material layer pattern 264P which surrounds the plurality of first material layer patterns 262P in a plan view. For example, the plurality of first material layer patterns 262P may include a material having first viscosity, and the second material layer pattern 264P may include a material having second viscosity which is higher than the first viscosity. The plurality of first material layer patterns 262P may be patterned in a shape corresponding to a center region of each of a plurality of chip regions CHR, and the second material layer pattern 264P surrounding the plurality of first material layer patterns 262P may have a shape corresponding to an outer region of each of the plurality of chip regions CHR.

The cover film 266 and the base film 268 may include plastic or resin having strength which is sufficient to support the insulating adhesive pattern 260P, and for example, may include polyethylene terephthalate (PET).

Referring to FIG. 15, a wafer W1 may be attached on a supporting substrate 410. The wafer W1 may include the plurality of chip regions CHR, and each of the plurality of chip regions CHR may include one of the first semiconductor chip 100 and the plurality of second semiconductor chips 200 described above with reference to FIGS. 1 to 13. In addition, each of the plurality of chip regions CHR may include a plurality of through electrodes 230 and a plurality of second rear connection pads 214. A plurality of chip connection terminals 250 may be disposed on an upper surface of the wafer W1. Each of the plurality of chip connection terminals 250 may be disposed on a corresponding one of the second front connection pads 212. Although not illustrated, a wiring layer may be formed on the wafer W1, and this wiring layer may form the second wiring layer 220 provided on the second substrate 202 of the second semiconductor chips 200 (see FIG. 1).

Figure 16:
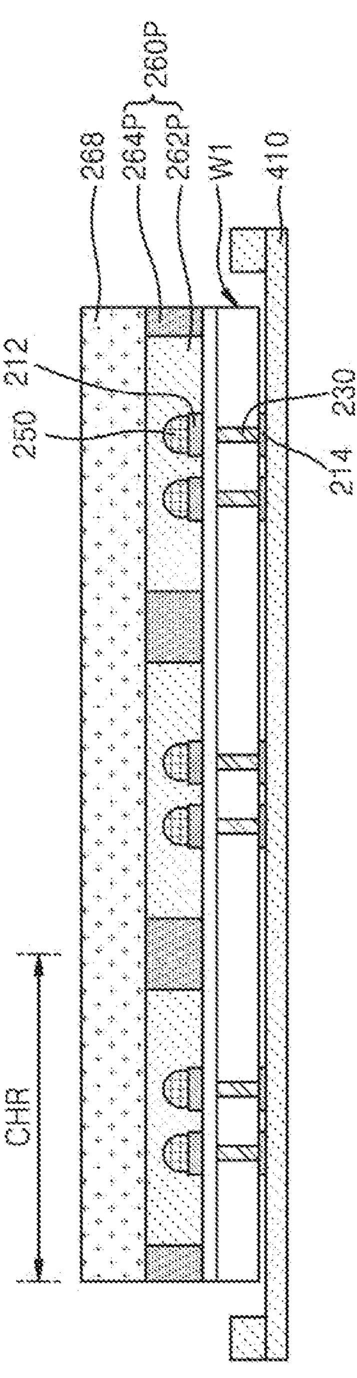

Referring to FIG. 16, the cover film 266 may be removed from the insulating adhesive film 260S, and the insulating adhesive pattern 260P and the base film 268 may be attached on the wafer W1. The insulating adhesive pattern 260P may be disposed to contact the upper surface of the wafer W1, and for example, the insulating adhesive pattern 260P may be disposed to cover an upper surface of the chip connection terminals 250.

In embodiments, the plurality of first material layer patterns 262P may be disposed on a center region of each of the plurality of chip regions CHR, and thus, each of the plurality of first material layer patterns 262P may be disposed to cover the chip connection terminals 250. The first material layer pattern 262P may include a material having first viscosity which is relatively low, and thus, the first material layer pattern 262P may tightly cover the chip connection terminals 250 without a void or an air bubble, near the chip connection terminals 250 on the wafer W1. For example, the first material layer pattern 262P may contact each of the chip connection terminals 250.

Figure 17:
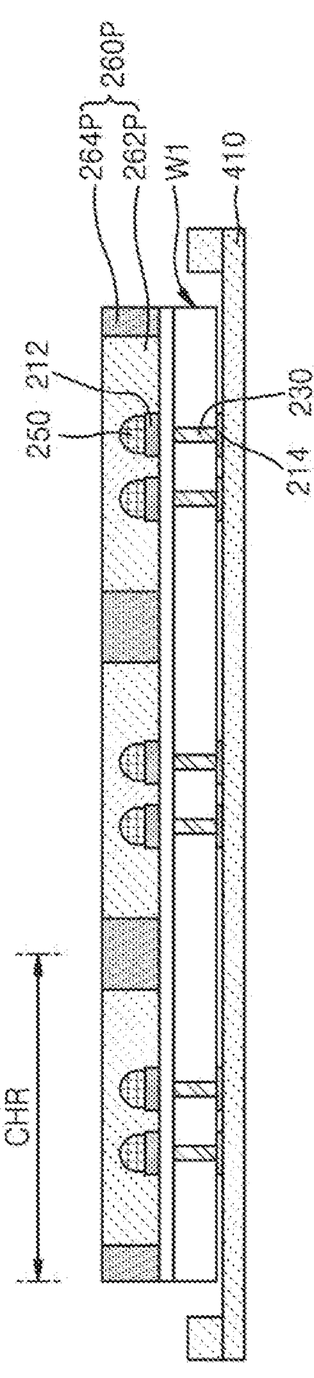

Referring to FIG. 17, the base film 268 attached on the insulating adhesive pattern 260P may be removed. After the base film 268 is removed, an upper surface of each of the first material layer pattern 262P and the second material layer pattern 264P may be exposed.

Figure 18:
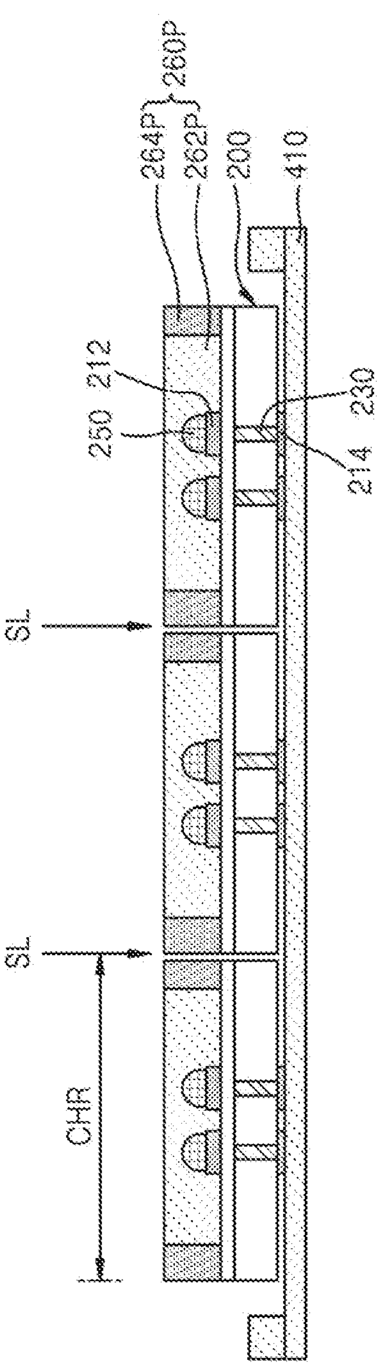

Referring to FIG. 18, the wafer W1 may be sawed along a scribe lane SL and may be singulated into the plurality of second semiconductor chips 200. The first material layer pattern 262P may be disposed on a center region of an upper surface of each of the second semiconductor chips 200, and the second material layer pattern 264P may be disposed on an outer region thereof.

Figure 19:
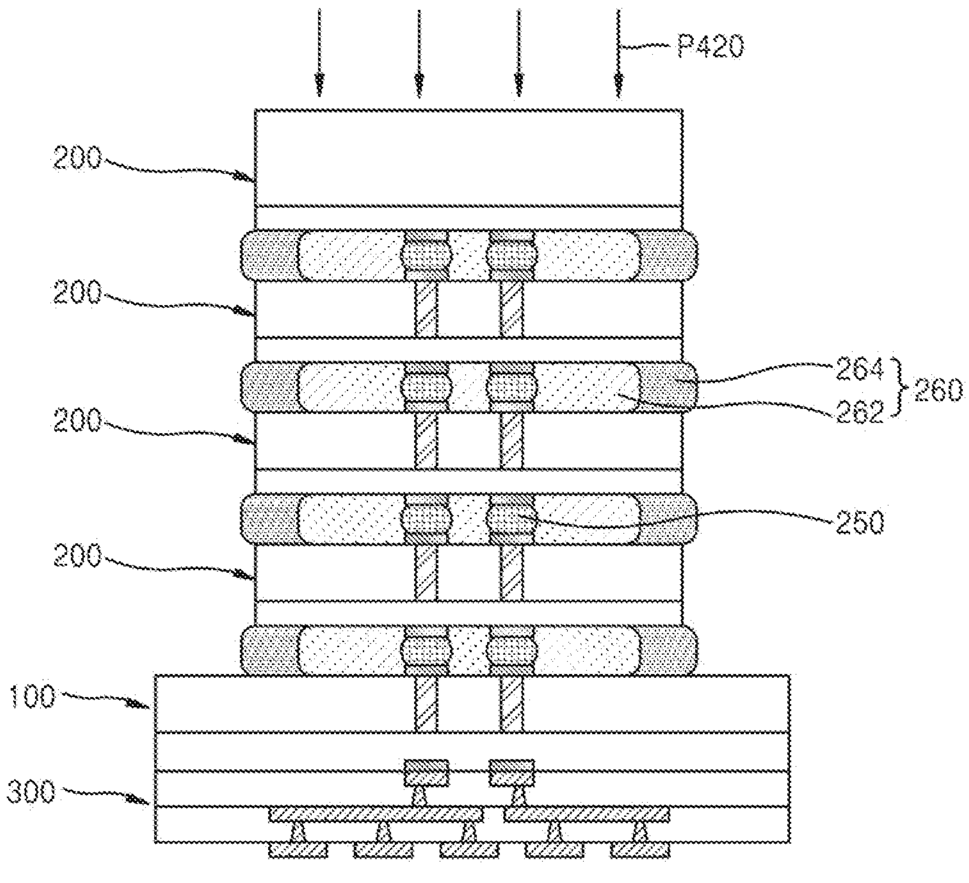

Referring to FIG. 19, the first semiconductor chip 100 attached on an interposer 300 may be prepared. In some embodiments, the first semiconductor chip 100 may be provided in a wafer state.

Subsequently, the plurality of second semiconductor chips 200 may be sequentially stacked on the first semiconductor chip 100. The plurality of second semiconductor chips 200 may be in a state where the insulating adhesive layer 260 is attached on the upper surface thereof to surround the chip connection terminals 250.

In embodiments, the chip connection terminals 250 may be solidly attached on a pad (for example, a front connection pad 212 and a rear connection pad 214 (see FIG. 1)) disposed at each of an upper portion and a lower portion thereof in a process of stacking the plurality of second semiconductor chips 200. For example, a thermal compression process P420 of applying certain heat and pressure to the plurality of second semiconductor chips 200 and the chip connection terminals 250 and the insulating adhesive layer 260 therebetween may be performed.

In embodiments, the insulating adhesive layer 260 disposed between the plurality of second semiconductor chips 200 may include the first material layer 262 and the second material layer 264, the first material layer 262 having relatively low viscosity may tightly cover a periphery of the chip connection terminals 250 without a void, and the second material layer 264 having relatively high viscosity may prevent the first material layer 262 from protruding toward the outside from a region between the plurality of second semiconductor chips 200. Accordingly, an excessive fillet may not be formed on side surfaces of the plurality of second semiconductor chips 200.

Figure 20:
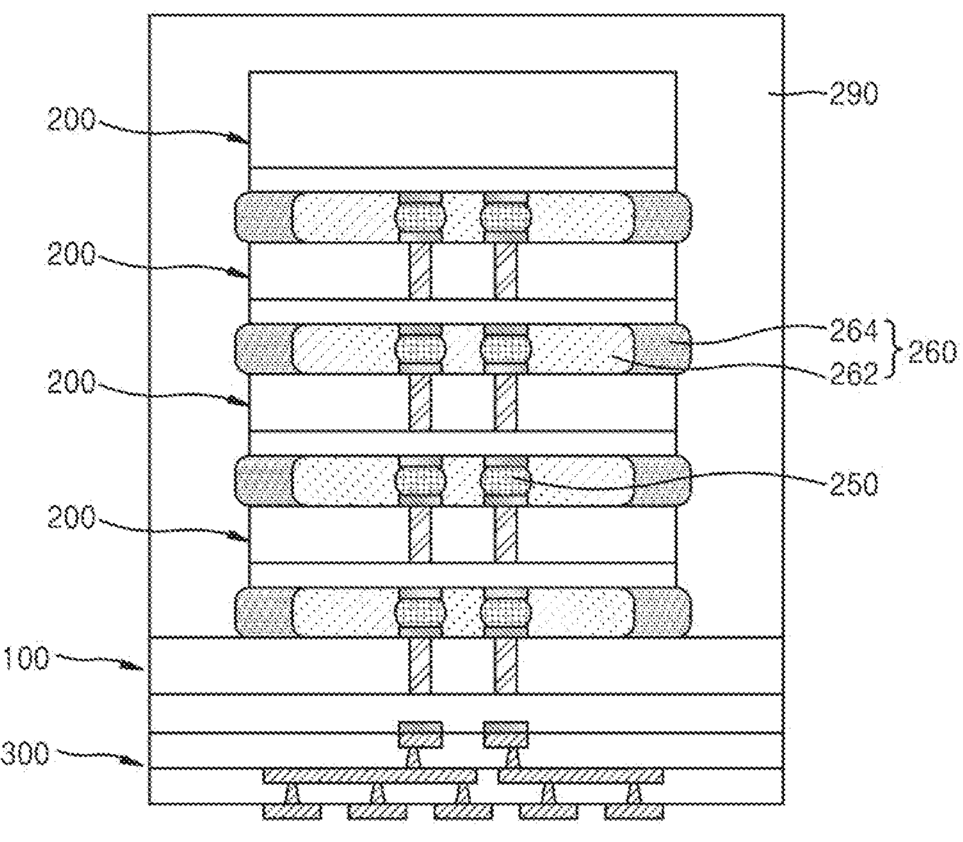

Referring to FIG. 20, a molding layer 290 covering the plurality of second semiconductor chips 200 may be formed on the first semiconductor chip 100. Subsequently, the semiconductor package 1 (see FIG. 1) may be formed by sawing the first semiconductor chip 100.

Figure 21:
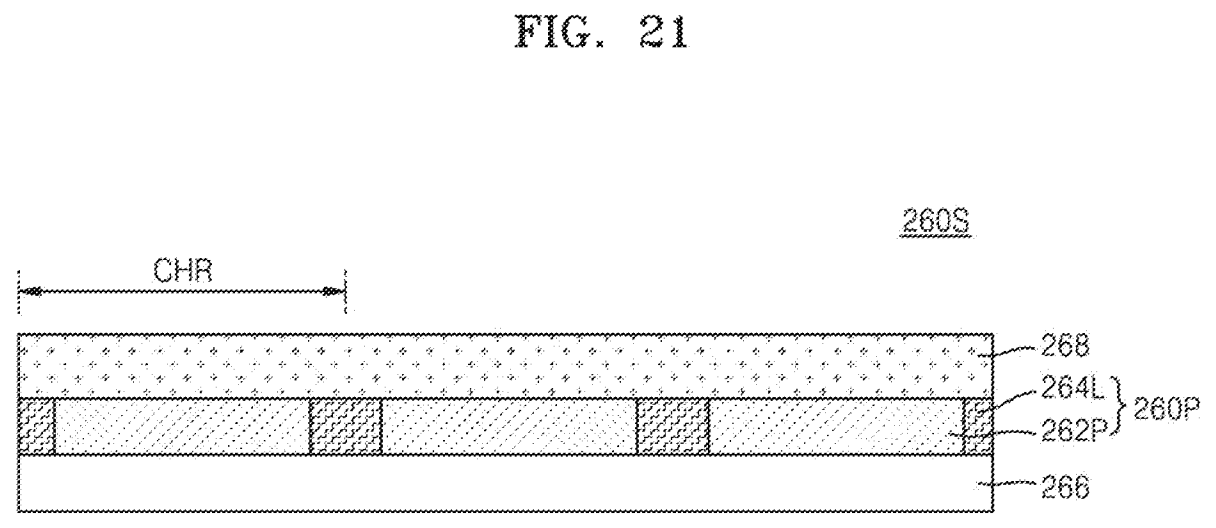
Figure 22:
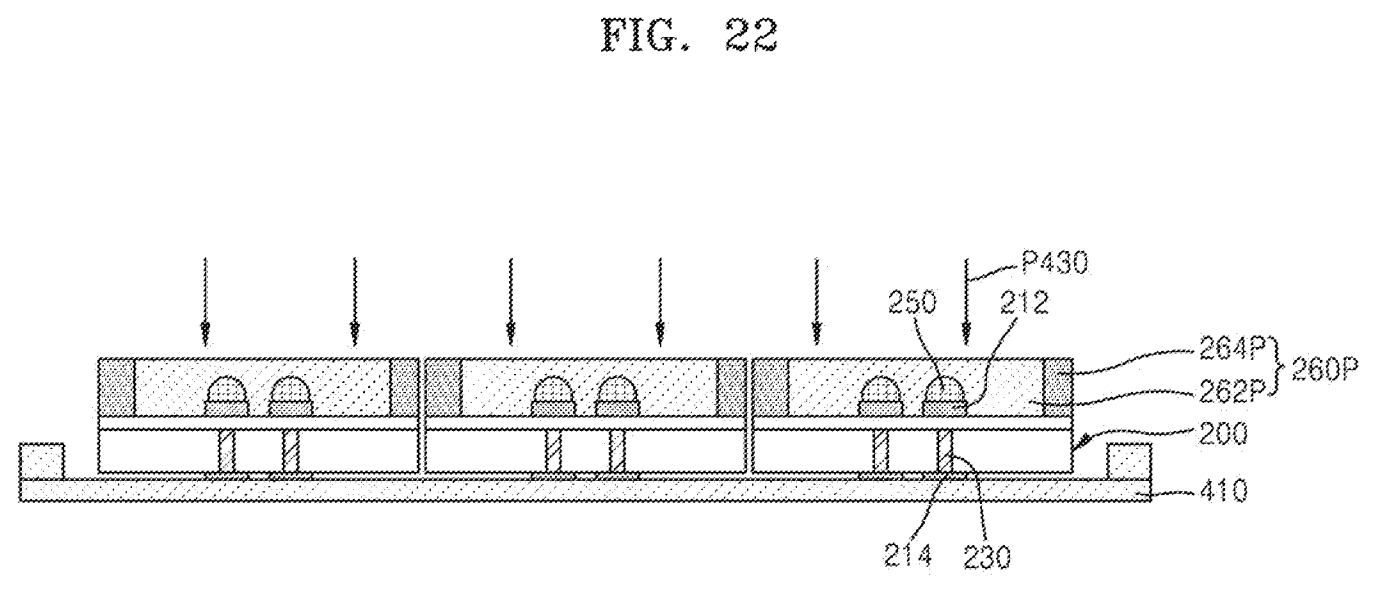
Figure 23:
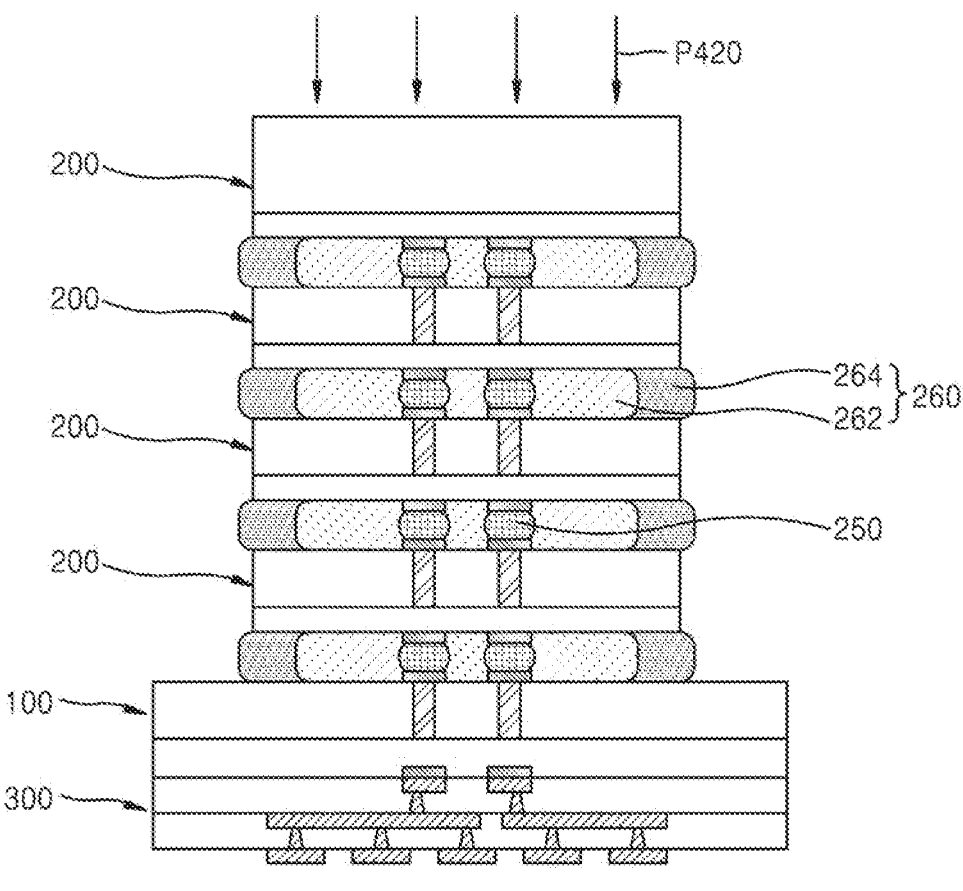

FIGS. 21 to 23 are cross-sectional views illustrating a method of manufacturing a semiconductor package, according to example embodiments.

Referring to FIG. 21, an insulating adhesive film 260S may be prepared. The insulating adhesive film 260S may include an insulating adhesive pattern 260P, a cover film 266, and a base film 268.

For example, the insulating adhesive film 260S may include a plurality of first material layer patterns 262P and a preliminary second material layer pattern 264L which one-dimensionally surrounds the plurality of first material layer patterns 262P. For example, the plurality of first material layer patterns 262P may include a material having first viscosity, and the preliminary second material layer pattern 264L may include a material having second viscosity which is higher than the first viscosity.

In embodiments, the plurality of first material layer patterns 262P may not include photo-curable resin, and the preliminary second material layer pattern 264L may include photo-curable resin. In embodiments, the plurality of first material layer patterns 262P may include photo-curable resin by a relatively low content, and the preliminary second material layer pattern 264L may include photo-curable resin by a relatively high content.

Subsequently, a wafer W1 may be singulated into a plurality of second semiconductor chips 200 by performing a process described above with reference to FIGS. 15 to 18.

Referring to FIG. 22, the preliminary second material layer pattern 264L may be changed to a second material layer pattern 264P by performing an UV irradiation process P430 on the individualized plurality of second semiconductor chips 200. For example, in a case where the preliminary second material layer pattern 264L includes photo-curable resin, the second material layer pattern 264P may have increased viscosity after the UV irradiation process P430 is performed.

Referring to FIG. 23, the plurality of second semiconductor chips 200 may be sequentially stacked on a first semiconductor chip 100. For example, a thermal compression process P420 of applying certain heat and pressure to the plurality of second semiconductor chips 200 and the chip connection terminals 250 and the insulating adhesive layer 260 therebetween may be performed. Subsequently, a semiconductor package 1 may be finished by performing a process described above with reference to FIG. 20.

In FIG. 22, an example where the UV irradiation process P430 is performed on the singulated second semiconductor chips 200 has been described above, but in other embodiments, the plurality of second semiconductor chips 200 may be sequentially aligned with one another on the first semiconductor chip 100, and then, the UV irradiation process P430 may be performed before a thermal compression process P420 is performed. In this case, the preliminary second material layer pattern 264L attached on each of the plurality of second semiconductor chips 200 may be changed to the second material layer pattern 264P simultaneously.

Hereinabove, embodiments have been described in the drawings and the specification. Embodiments have been described by using the terms described herein, but this has been merely used for describing the inventive concept and has not been used for limiting a meaning or limiting the scope of the inventive concept defined in the following claims. Therefore, it may be understood by those of ordinary skill in the art that various modifications and other equivalent embodiments may be implemented from the inventive concept. Accordingly, the spirit and scope of the inventive concept may be defined based on the spirit and scope of the following claims.

While the inventive concept has been particularly shown and described with reference to embodiments thereof, it will be understood that various changes in form and details may be made therein without departing from the spirit and scope of the following claims.

What is claimed is:

1. A semiconductor package comprising:
a first semiconductor chip;
a plurality of second semiconductor chips sequentially stacked on the first semiconductor chip;
a front connection pad disposed on a lower surface of each of the plurality of second semiconductor chips;
a rear connection pad attached on an upper surface of the first semiconductor chip and each of the plurality of second semiconductor chips;
a chip connection terminal disposed between the front connection pad and the rear connection pad; and
an insulating adhesive layer disposed between the first semiconductor chip and a lowermost second semiconductor chip and between two adjacent second semiconductor chips of the plurality of second semiconductor chips, the insulating adhesive layer including a first material layer covering a sidewall of the chip connection terminal and having a first viscosity and a second material layer disposed to surround the first material layer in a plan view and having a second viscosity which is greater than the first viscosity,
wherein the insulating adhesive layer is a non-conductive film, and
wherein, in the plan view, the first material layer is provided in a center region of the plurality of second semiconductor chips, and the second material layer does not overlap the first material layer in the center region of the plurality of second semiconductor chips.

2. The semiconductor package of claim 1, wherein a content of a ceramic filler included in the second material layer is greater than a content of a ceramic filler included in the first material layer.

3. The semiconductor package of claim 1, wherein an average diameter of a ceramic filler included in the second material layer is greater than an average diameter of a ceramic filler included in the first material layer.

4. The semiconductor package of claim 1, wherein the second viscosity is greater than or equal to 120% of the first viscosity.

5. The semiconductor package of claim 4,
wherein the first viscosity is within a range of 500 Pa·s (pascal·second) to 5,000 Pa·s, and
wherein the second viscosity is within a range of 600 Pa·s to 6,000 Pa·s.

6. The semiconductor package of claim 1,
wherein the first material layer is disposed on an upper surface of a second semiconductor chip in the center region of the plurality of second semiconductor chips, and
wherein the second material layer is disposed on an outer region of the upper surface of the second semiconductor chip.

7. The semiconductor package of claim 1, wherein a height of the first material layer in a vertical direction is equal to a height of the second material layer in the vertical direction.

8. The semiconductor package of claim 1, wherein, in a plan view, an upper surface of each of the plurality of second semiconductor chips has a first area, and the second material layer has a second area which is 10% to 20% of the first area.

9. The semiconductor package of claim 1, further comprising:
an interposer attached on a lower surface of the first semiconductor chip; and
a molding layer covering the plurality of second semiconductor chips and the insulating adhesive layer, on the first semiconductor chip.

10. The semiconductor package of claim 9, wherein the molding layer contacts the second material layer and does not contact the first material layer.

11. A semiconductor package comprising:
a first semiconductor chip;
a plurality of second semiconductor chips sequentially stacked on the first semiconductor chip;
a front connection pad disposed on a lower surface of each of the plurality of second semiconductor chips;
a rear connection pad attached on an upper surface of the first semiconductor chip and each of the plurality of second semiconductor chips;

a chip connection terminal disposed between the front connection pad and the rear connection pad;

an insulating adhesive layer disposed between the first semiconductor chip and a lowermost second semiconductor chip and between two adjacent second semiconductor chips of the plurality of second semiconductor chips, the insulating adhesive layer including a first material layer covering a sidewall of the chip connection terminal and a second material layer disposed on at least one side of the first material layer to have viscosity which is greater than viscosity of the first material layer; and a molding layer covering side surfaces of the first semiconductor chip and the plurality of second semiconductor chips and directly contacting a side surface of the second material layer, wherein a maximum height of the first material layer in a vertical direction is equal to a maximum height of the second material layer in the vertical direction.

12. The semiconductor package of claim 11, wherein the first material layer is disposed on a center region of an upper surface of the first semiconductor chip, and wherein the second material layer is disposed on an outer region of the upper surface of the first semiconductor chip.

13. The semiconductor package of claim 11, wherein the first material layer does not directly contact the molding layer.

14. The semiconductor package of claim 11, wherein a content of a ceramic filler included in the first material layer is less than a content of a ceramic filler included in the second material layer.

15. The semiconductor package of claim 11, wherein an average diameter of a ceramic filler included in the first material layer is less than an average diameter of a ceramic filler included in the second material layer.

16. The semiconductor package of claim 11, wherein the first material layer has a first viscosity and the first viscosity is within a range of 500 Pa·s to 5,000 Pa·s, and wherein the second material layer has a second viscosity and the second viscosity is within a range of 600 Pa·s to 6,000 Pa·s.

17. The semiconductor package of claim 16, wherein the second viscosity is greater than or equal to 120% of the first viscosity.

18. A semiconductor package comprising:

a redistribution layer (RDL) interposer;

a buffer chip including a first substrate, a plurality of first through electrodes passing through at least a portion of the first substrate, a first wiring layer disposed on an active surface of the first substrate, the first wiring layer including a plurality of first wiring patterns, and a plurality of first wiring vias, a first inter-wiring insulation layer surrounding the plurality of first wiring patterns and the plurality of first wiring vias, the active surface of the first substrate facing the RDL interposer, and the buffer chip being attached on the RDL interposer;

a plurality of memory cell chips each including a second substrate, a plurality of second through electrodes passing through at least a portion of the second substrate, a second wiring layer disposed on an active surface of the second substrate, the second wiring layer including a plurality of second wiring patterns, a plurality of second wiring vias, and a second inter-wiring insulation layer surrounding the plurality of second wiring patterns and the plurality of second wiring vias, the active surface of the second substrate facing the buffer chip, and the plurality of memory cell chips being sequentially stacked on the buffer chip;

a plurality of front connection pads attached on a lower surface of the second wiring layer;

a plurality of rear connection pads attached on an inactive surface of the first substrate and an inactive surface of the second substrate;

a plurality of chip connection terminals disposed between the buffer chip and the plurality of memory cell chips and between the plurality of front connection pads and the plurality of rear connection pads;

an insulating adhesive layer disposed between the buffer chip and the plurality of memory cell chips, the insulating adhesive layer including a first material layer covering a sidewall of a corresponding chip connection terminal and a second material layer disposed on at least one side of the first material layer to have viscosity which is greater than viscosity of the first material layer; and a molding layer surrounding the plurality of memory cell chips and the insulating adhesive layer, on the buffer chip, wherein a maximum height of the first material layer in a vertical direction is equal to a maximum height of the second material layer in the vertical direction.

19. The semiconductor package of claim 18, wherein the first material layer has a first viscosity and the first viscosity is within a range of 500 Pa·s to 5,000 Pa·s, wherein the second material layer has a second viscosity and the second viscosity is within a range of 600 Pa·s to 6,000 Pa·s, and wherein the second viscosity is greater than or equal to 120% of the first viscosity.

20. The semiconductor package of claim 18, wherein a content of a ceramic filler included in the first material layer is less than a content of a ceramic filler included in the second material layer.

* * * * *